(12) United States Patent
Sato et al.

(10) Patent No.: US 7,598,009 B2
(45) Date of Patent: *Oct. 6, 2009

(54) PHOTOSENSITIVE RESIN COMPOSITION, PRODUCTION METHOD FOR CURED RELIEF PATTERN USING IT, AND SEMICONDUCTOR DEVICE

(75) Inventors: Kenichiro Sato, Shizuoka (JP); Naoya Sugimoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/182,347

(22) Filed: Jul. 30, 2008

(65) Prior Publication Data

US 2009/0035693 A1     Feb. 5, 2009

(30) Foreign Application Priority Data

Jul. 31, 2007     (JP) .......................... P2007-199341

(51) Int. Cl.
*G03F 7/004* (2006.01)
*G03F 7/30* (2006.01)

(52) U.S. Cl. .................. 430/18; 430/191; 430/192; 430/193; 430/270.1; 430/326; 430/330; 430/906

(58) Field of Classification Search ................. 430/191, 430/192, 193, 270.1, 326, 330, 18, 906
See application file for complete search history.

(56) References Cited

U.S. PATENT DOCUMENTS 7,056,641 B2 *   6/2006   Naiini et al. ................ 430/190

FOREIGN PATENT DOCUMENTS

| JP | 56-27140 A | 3/1981 |
|---|---|---|
| JP | 2002-526793 A | 8/2002 |
| JP | 2006-10781 A | 1/2006 |
| JP | 2006-126809 A | 5/2006 |

* cited by examiner

*Primary Examiner*—John S Chu
(74) *Attorney, Agent, or Firm*—Sughrue Mion, PLLC

(57) ABSTRACT

According to the present invention, there is provided: a photosensitive resin composition comprising a polyamide resin having a specific structure, a photosensitive agent, and a compound having at least two sulfonate ester groups; a production method for a cured relief pattern using the photosensitive resin composition; and a semiconductor device containing the cured relief pattern formed according to the production method.

8 Claims, No Drawings

PHOTOSENSITIVE RESIN COMPOSITION, PRODUCTION METHOD FOR CURED RELIEF PATTERN USING IT, AND SEMICONDUCTOR DEVICE

BACKGROUND OF THE INVENTION

1. Field of the Invention

The present invention relates to a positive, high heat-resistant photosensitive resin composition usable for surface protective film and interlayer insulating film in semiconductor devices and for interlayer insulating film in display devices, to a production method for a heat-resistant, cured relief pattern using the positive, high heat-resistant photosensitive resin composition, and to a semiconductor device containing the relief pattern.

2. Description of the Related Art

For surface protective film and interlayer insulating film in semiconductor devices, used is polyimide resin that has excellent heat resistance, electric properties and mechanical properties. The polyimide resin is, at present, supplied generally as a photosensitive polyimide precursor composition; and this is applied onto a support, and then patterned, developed and processed for thermal imidation, thereby readily forming a surface protective film, an interlayer insulating film or the like in a semiconductor device; and the composition is characterized in that the process with it may be greatly shortened as compared with a conventional non-photosensitive polyimide precursor composition.

However, the photosensitive polyimide precursor composition requires a large quantity of an organic solvent such as N-methyl-2-pyrrolidone as the developer in the development step, and in view of the recent increase in environmental problems, an organic solvent-free method is desired. Given that situation, recently, various proposals of a heat-resistant photosensitive resin material developable with an aqueous alkali solution like photoresist have been made.

Above all, recently, a method of using a PBO precursor composition, which is prepared by mixing an aqueous alkali solution-soluble hydroxypolyamide, such as polybenzoxazole (PBO) precursor with an optically-active ingredient such as a photosensitive diazoquinone compound, as a positive photosensitive resin composition has come to attract special attention.

The development mechanism of the positive photosensitive resin is as follows: A non-exposed photosensitive diazoquinone compound is insoluble in an aqueous alkali solution, but after exposed to light, the photosensitive diazoquinone compound undergoes chemical change to be an indenecarboxylic acid compound and becomes soluble in an aqueous alkali solution. Based on the dissolution speed difference between the exposed part and the non-exposed part, only the non-exposed part may form a relief pattern (for example, see JP-A-56-27140).

On the other hand, as a technique of separating the photosensitivity from the insoluble function of the non-exposed part, in the field of semiconductor photoresists, much employed is a chemical amplification-type photosensitive composition of such that it generates a catalytic amount of an acid through exposure to light, and then in the subsequent heating process, the alkali-insoluble group in the composition is converted into an alkali-soluble group through chemical reaction with the acid having been generated through the photoexposure and acting as a catalyst. Also in the technical field of the present invention, such a chemical amplification-type photosensitive composition is disclosed (for example, see JP-T-2002-526793).

However, with the recent development of semiconductor technology, finer pattern fabrication is required and it is also required to lower the curing temperature after patterning.

In particular, when the curing temperature is lowered, it is known that thermal benzoxazole cyclization is hardly promoted. Regarding this problem, for example, it has already been reported that the problem could be solved by addition of sulfonic acid or a sulfate compound (for example see JP-A-2006-010781 and JP-A-2006-126809). However, it has been known that even these compounds are still insufficient.

Specifically, a material having excellent lithography performance (film retentiveness, resolution performance), capable of curing at a low temperature not higher than 250° C. and having heat resistance has not as yet been found out.

SUMMARY OF THE INVENTION

The invention is to provide a photosensitive resin composition having lithography performance comparable to that of semiconductor photoresist and capable of forming a cured relief pattern having excellent heat resistance through low-temperature curing; a production method for a cured relief pattern using the photosensitive resin composition; and a semiconductor device containing the cured relief pattern formed according to the production method.

The present inventors have found that the above-mentioned problems can be solved by a photosensitive resin composition comprising a polyamide resin having a specific structure and a photosensitive agent, and in addition to these, further containing a sulfonate ester compound having a specific structure, and have completed the present invention. Specifically, the subject matter of the invention is attained by the following:

[1] A photosensitive resin composition comprising:

(A) a polyamide resin comprising a structure represented by general formula (1);

(B) a photosensitive agent; and (C) a sulfonate ester represented by general formula (2),

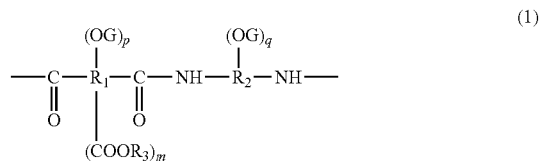

wherein $R_1$ represents a 2-valent to 8-valent organic group having at least 2 carbon atoms; $R_2$ represents a 2-valent to 6-valent organic group having at least 2 carbon atoms;

G and $R_3$ each independently represents a hydrogen atom or an organic group having from 1 to 20 carbon atoms; m indicates an integer of from 0 to 2; p and q each independently indicates an integer of from 0 to 4, provided that p+q>0,

wherein A represents an h-valent linking group;

$R_0$ represents an alkyl group, an aryl group, an aralkyl group or a cyclic alkyl group;

$R_0'$ represents a hydrogen atom, an alkyl group or an aralkyl group; and h indicates from 2 to 8.

[2] The photosensitive resin composition of the above [1], wherein the polyamide resin contains a structure represented by general formula (3):

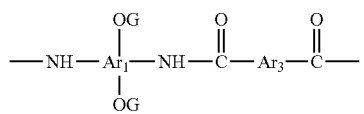

(3)

wherein $Ar_1$ represents a group selected from a 4-valent aromatic group and a 4-valent heterocyclic group; $Ar_3$ represents a group selected from a 2-valent aromatic group, a 2-valent heterocyclic group, a 2-valent aliphatic group and a 2-valent alicyclic group; G has the same meaning as in formula (1).

[3] The photosensitive resin composition of the above [2], wherein the polyamide resin further comprises a structure represented by general formula (4):

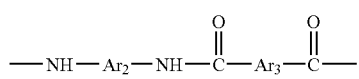

(4)

wherein $Ar_2$ represents a group selected from a 2-valent aromatic group, a 2-valent heterocyclic group, a 2-valent alicyclic group, and a 2-valent aliphatic group which may have silicon ; $Ar_3$ represents a group selected from a 2-valent aromatic group, a 2-valent heterocyclic group, a 2-valent aliphatic group and a 2-valent alicyclic group.

[4] The photosensitive resin composition of the above [2], wherein a protective group represented by the group G in formula (3) is a group that decomposes by action of an acid to generate an alkali-soluble group.

[5] The photosensitive resin composition of any of the above [1] to [4], further comprising (D) a compound containing an alkoxymethyl group or an acyloxymethyl group.

[6] The photosensitive resin composition of any of the above [1] to [5], further comprising (E) an adhesion promoter.

[7] A method for producing a cured relief pattern, the method comprising: forming a layer of the photosensitive resin composition of any of the above [1] to [6], on a semiconductor substrate; exposing the layer to any of light rays, electron rays and ion rays via a mask so as to form an exposed part; removing the exposed part with an aqueous alkali developer to form an relief pattern; and heating the relief pattern so as to form the cured relief pattern.

[8] A semiconductor device comprising the cured relief pattern obtained in the production method of above [7].

DETAILED DESCRIPTION OF THE INVENTION

The invention is described in detail hereinunder.

The photosensitive resin composition of the invention comprises (A) a polyamide resin having a structure represented by the following general formula (1), (B) a photosensitive agent, and (C) a sulfonate ester represented by the following general formula (2).

(1) Polyamide Resin:

The polyamide resin in the invention has a structure represented by the following general formula (1):

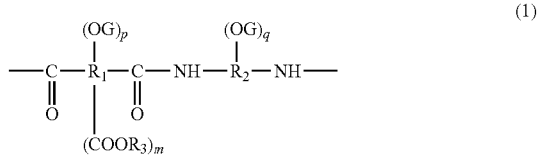

(1)

wherein $R_1$ represents a 2-valent to 8-valent organic group having at least 2 carbon atoms; $R_2$ represents a 2-valent to 6-valent organic group having at least 2 carbon atoms;

G and $R_3$ each independently represent any of a hydrogen atom or an organic group having from 1 to 20 carbon atoms; m indicates an integer of from 0 to 2; p and q each independently indicate an integer of from 0 to 4, provided that p+q>0.

In particular, the polyamide resin in the invention is preferably a polyamide resin containing a structure represented by the following general formula (3) and general formula (4):

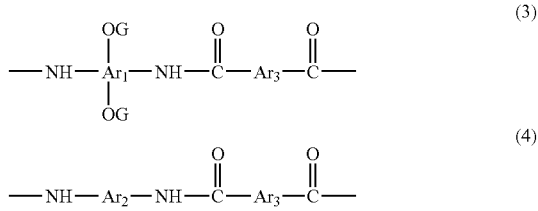

(3)

(4)

wherein $Ar_1$ represents a group selected from a 4-valent aromatic group and a 4-valent heterocyclic group; $Ar_2$ represents a group selected from a 2-valent aromatic group, a 2-valent heterocyclic group, a 2-valent alicyclic group, and a 2-valent aliphatic group which may have silicon; $Ar_3$ represents a group selected from a 2-valent aromatic group, a 2-valent heterocyclic group, a 2-valent aliphatic group and a 2-valent alicyclic group; G has the same meaning as in formula (1).

In the above, the number of the structures represented by formula (3) in one molecule of the resin is from 5 to 1000, and the number of the structures represented by formula (4) in one molecule of the resin is from 0 to 900.

The resin having the structure represented by formula (1) generally has a degree of polymerization of from 10 to 1000, and may be produced, for example, by reacting the following monomers (A), (B) and (C) in the presence of a base or a dehydrating condensing agent.

(A)

(B)

(C)

In the formulae, Ar1, Ar2 and Ar3 are as previously defined in the above; W represents —Cl, —OR, or —OH, in which R represents an alkyl group (preferably having from 1 to 10 carbon atoms), a cycloalkyl group (preferably having from 3 to 10 carbon atoms), or an aryl group (preferably having from 6 to 10 carbon atoms), for example, including —CH$_3$, —C$_2$H$_5$, n-C$_3$H$_7$, i-C$_3$H$_7$, n-C$_4$H$_9$, t-C$_4$H$_9$, cyclohexyl, phenyl, p-chlorophenyl, p-nitrophenyl.

The ratio of [(A)+(B)]/(C) is generally between about 0.9 and 1.1. The monomer (A) accounts for from about 10 to 100 mol % of [(A)+(B)]; and the monomer (B) accounts for from about 0 to 90 mol % of [(A)+(B)].

The bisaminophenol having a structure of (A) Ar$_1$(NH$_2$)$_2$(OH)$_2$ includes, for example, 3,3'-dihydroxybenzidine, 3,3'-diamino-4,4'-dihydroxybiphenyl, 4,4'-diamino-3,3'-dihydroxybiphenyl, 3,3'-diamino-4,4'-dihydroxydiphenyl sulfone, 4,4'-diamino-3,3'-dihydroxydiphenyl sulfone, bis(3-amino-4-hydroxyphenyl)methane, 2,2-bis(3-amino-4-hydroxyphenyl)propane, 2,2-bis(3-amino-4-hydroxyphenyl)hexafluoropropane, 2,2-bis(4-amino-3-hydroxyphenyl)hexafluoropropane, bis(4-amino-3-hydroxyphenyl)methane, 2,2-bis(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, 1,3-diamino-4,6-dihydroxybenzene. One or more of these bisaminophenols may be used either singly or as combined.

Of the bisaminophenols having the structure (A), especially preferred are those where Ar$_1$ is an aromatic group selected from the following:

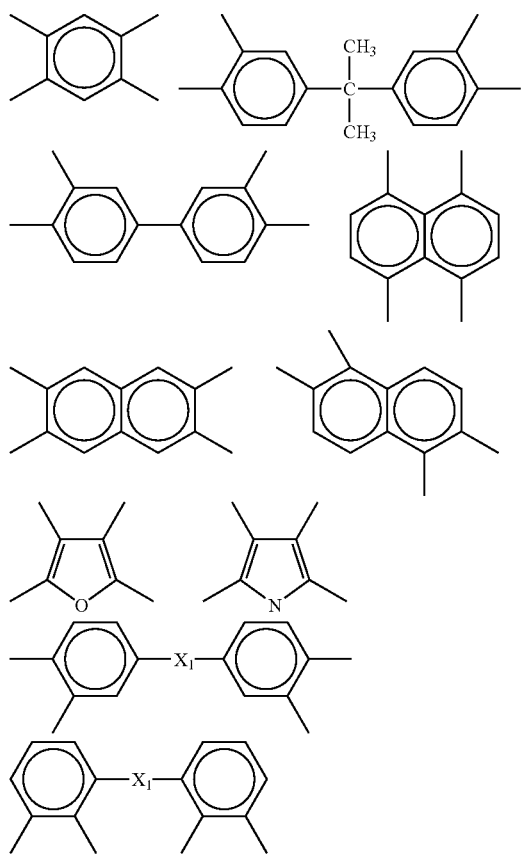

In the formulae, X$_1$ represents —O—, —S—, —C(CF$_3$)$_2$—, —CH$_2$—, —SO$_2$—, —NHCO—. In the above structures, —OH and —NH$_2$ in the structure (A) bond in the ortho-position (adjacent position) to each other.

The diamine having a structure (B) Ar$_2$(NH$_2$)$_2$ includes an aromatic diamine and a siliconediamine.

Of those, the aromatic diamine includes, for example, m-phenylenediamine, p-phenylenediamine, 2,4-tolylenediamine, 3,3'-diaminodiphenyl ether, 3,4'-diaminodiphenyl ether, 4,4'-diaminodiphenyl ether, 3,3'-diaminodiphenyl sulfone, 4,4'-diaminodiphenyl sulfone, 3,4'-diaminodiphenyl sulfone, 3,3'-diaminodiphenylmethane, 4,4'-diaminodiphenylmethane, 3,4'-diaminodiphenyl methane, 4,4'-diaminodiphenyl sulfide, 3,3'-diaminodiphenyl ketone, 4,4'-diaminodiphenyl ketone, 3,4'-diaminodiphenyl ketone, 2,2'-bis(4-aminophenyl)propane, 2,2'-bis(4-aminophenyl)hexafluoropropane, 1,3-bis(3-aminophenoxy)benzene, 1,3-bis(4-aminophenoxy)benzene, 1,4-bis(4-aminophenoxy)benzene, 4-methyl-2,4-bis(4-aminophenyl)-1-pentene, 4-methyl-2,4-bis(4-aminophenyl)-2-pentene, 1,4-bis(α,α-dimethyl-4-aminobenzyl)benzene, imino-di-p-phenylenediamine, 1,5-diaminonaphthalene, 2,6-diaminonaphthalene, 4-methyl-2,4-bis(4-aminophenyl)pentane, 5 (or 6)-amino-1-(4-aminophenyl)-1,3,3-trimethylindane, bis(p-aminophenyl)phosphine oxide, 4,4'-diaminoazobenzene, 4,4'-diaminodiphenylurea, 4,4'-bis(4-aminophenoxy)biphenyl, 2,2-bis[4-(4-aminophenoxy)phenyl]propane, 2,2-bis[4-(4-aminophenoxy)phenyl]hexafluoropropane, 2,2-bis[4-(3-aminophenoxy)phenyl]benzophenone, 4,4'-bis(4-aminophenoxy)diphenyl sulfone, 4,4'-bis[4-(α,α-dimethyl-4-aminobenzyl)phenoxy]diphenyl sulfone, 4,4'-diaminobiphenyl, 4,4'-diaminobenzophenone, phenylindanediamine, 3,3'-dimethoxy-4,4'-diaminobiphenyl, 3,3'-dimethyl-4,4'-diaminobiphenyl, o-toluidine sulfone, 2,2-bis(4-aminophenoxyphenyl)propane, bis(4-aminophenoxyphenyl) sulfone, bis(4-aminophenoxyphenyl)sulfide, 1,4-(4-aminophenoxyphenyl)benzene, 1,3-(4-aminophenoxyphenyl)benzene, 9,9-bis(4-aminophenyl)fluorenone, 4,4'-(3-aminophenoxy)diphenyl sulfone, 4,4'-diaminobenzanilide, and compounds derived from those aromatic diamine by substituting the hydrogen atom of the aromatic nucleus therein with at least one or atom selected from a group consisting of a chlorine atom, a fluorine atom, a bromine atom, a methyl group, a methoxy group, a cyano group and a phenyl group.

A siliconediamine may be selected for increasing the adhesiveness to substrates, and its examples are bis(4-aminophenyl)dimethylsilane, bis(4-aminophenyl)tetramethylsiloxane, bis(4-aminophenyl)tetramethyldisiloxane, bis(γ-aminopropyl)tetramethyldisiloxane, 1,4-bis (γ-aminopropyldimethylsilyl)benzene, bis(4-aminobutyl)tetramethyldisiloxane, bis (γ-aminopropyl)tetraphenyldisiloxane.

As the siliconediamine, also mentioned is the following structure.

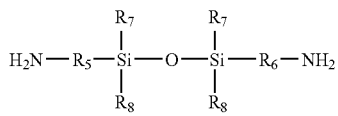

In the above, R$_5$ and R$_6$ each represent a divalent organic group, R$_7$ and R$_8$ each represent each represent monovalent organic group. The divalent organic group represented by R$_5$ and R$_6$ is, for example, a linear or branched alkylene group having from 1 to 20 carbon atoms, a phenylene group having from 6 to 20 carbon atoms or a divalent alicyclic group having from 3 to 20 carbon atoms, which may have a substituent, and a group to be formed by combining them. The monovalent organic group represented by $R_7$ and $R_8$ is, for example, a linear or branched alkyl group having from 1 to 20 carbon atoms or an aryl group having from 6 to 20 carbon atoms, which may have a substituent.

More concretely, they include the following:

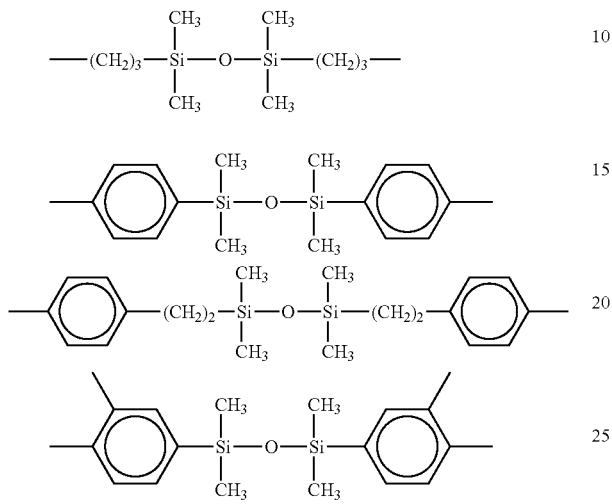

The alicyclic group preferably has from 3 to 20 carbon atoms, and more preferably, it includes the following structures:

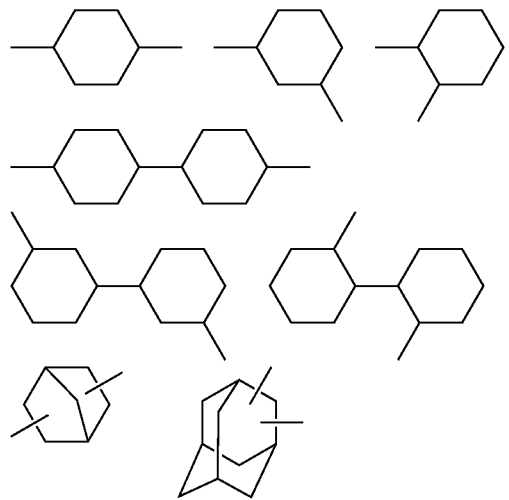

The compound having a structure (C) includes those in which Ar3 is an aromatic group, a heterocyclic group or an aliphatic group selected from the following groups.

Examples of the aromatic group and the heterocyclic group are mentioned below.

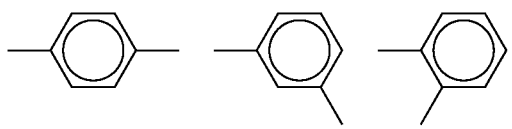

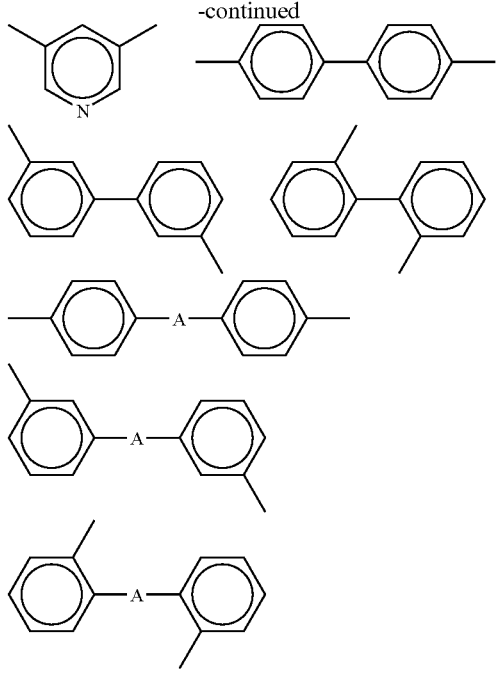

In the formulae, A represents a divalent group selected from a group of —$CH_2$—, —O—, —S—, —$SO_2$—, —CO—, —NHCO—, —$C(CF_3)_2$—.

The aliphatic group includes a linear, branched or cyclic divalent structure having from 1 to 20 carbon atoms. More preferably, it is a cyclic aliphatic group having from 3 to 15 carbon atoms, including the following structures.

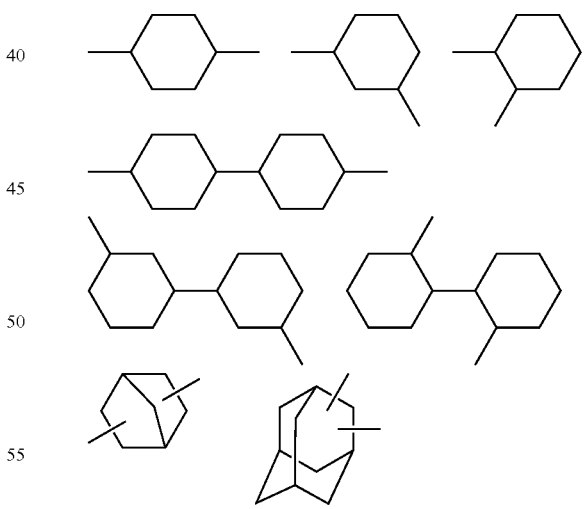

The group represented by Ar3 preferably has —$COOR_3$ as the substituent, in which R3 represents a hydrogen atom or an organic group having from 1 to 20 carbon atoms.

From the viewpoint of the storability, the above resin is preferably blocked at the terminal of the carboxyl group or the amino group.

For example, there may be mentioned structures represented by the following general formulae:

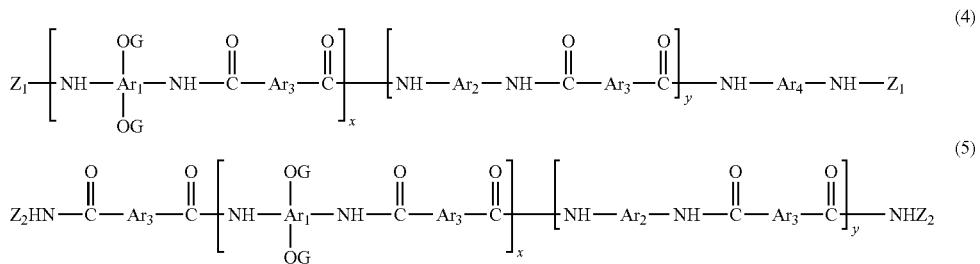

In formula (4), the terminal group may be readily introduced by reacting the terminal amino group with an acid anhydride or an acid chloride. $Z_1$ represents a monovalent organic group bonding to the formula via a carbonyl group or a sulfonyl group; and the organic group represented by $Z_1$ preferably has at least one carboxyl group, ester group, alkenyl group or alkynyl group. When the terminal group could be a polymerization point in heating for curing, then it is especially preferred as capable of improving the physical properties of the cured film.

$Z_2$ represents a monovalent organic group, and is preferably an aryl group which may have a substituent. Preferably, the group has, as the substituent, at least one carboxyl group, ester group, alkenyl group or alkynyl group. When the terminal group could be a polymerization point in heating for curing, then it is especially preferred as capable of improving the physical properties of the cured film.

Concretely, it is desirable that, after a polyamide resin (not containing $Z_1$) that could be the base having a structure represented by formula (1) and a structure represented by formula (3) has been produced, the terminal amino group in the polyamide resin is capped with an acid anhydride or an acid derivative capable of bonding thereto via a carbonyl group or a sulfonyl group, thereby giving an amide. Preferred examples of the group represented by $Z_1$ are, for example, the following, to which, however, the invention should not be limited.

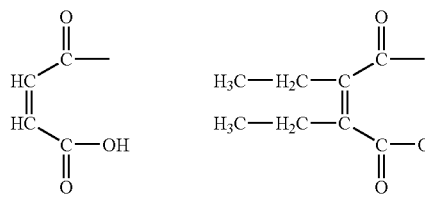

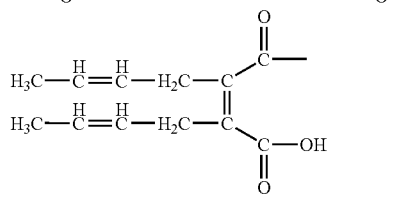

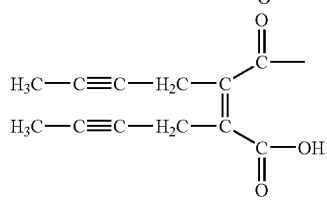

-continued

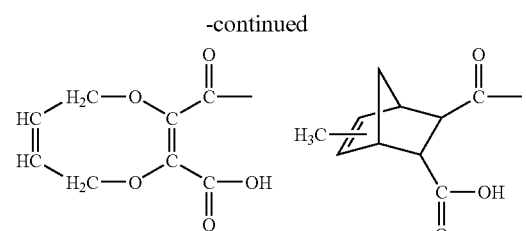

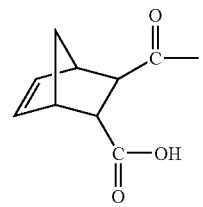

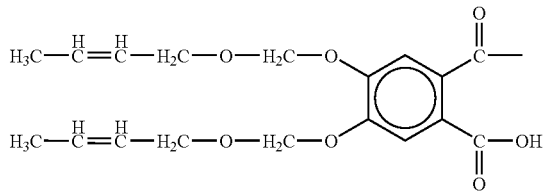

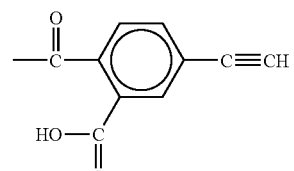

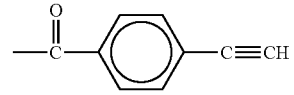

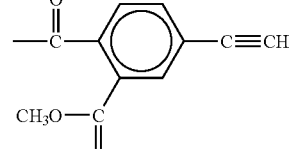

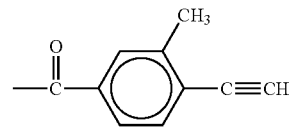

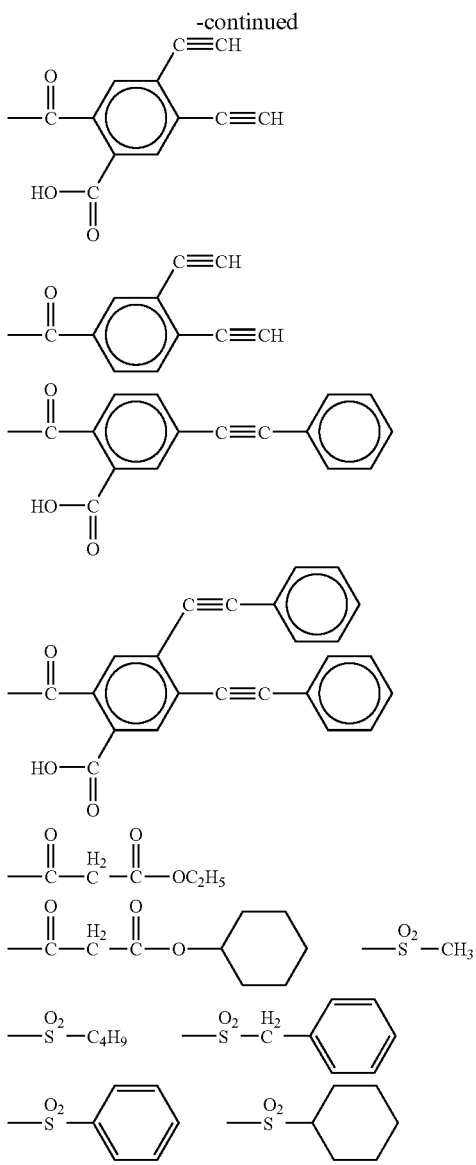

Of those, especially preferred are the groups selected from the following. Two or more of these may be combined for use herein.

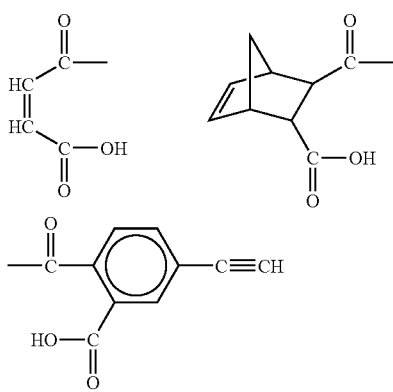

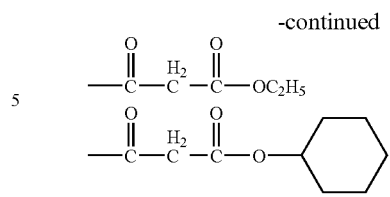

In case where the resin has a —COOH group on the carbon atom adjacent to the carbon of the amido bond therein, the group may be imidated. In the invention, the terminal group is preferably a group of the case. The imidated terminal group structure includes, for example, the following:

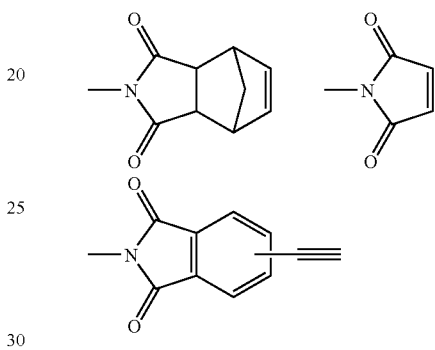

In producing the resin having a terminal group represented by formula (5), a monofunctional amine ($Z_2$-$NH_2$) may be added to the monomers (A) to (C) and reacted with them.

Preferred terminal groups are the following structures.

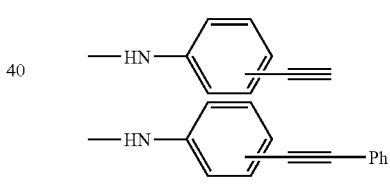

Not specifically defined, the group G for protecting the hydroxyl group in the above resin may be any organic group capable of protecting a hydroxyl group, and it may be a group capable of leaving through action with an acid or a group not leaving through action with an acid.

To the protecting reaction, for example, applicable is a reaction of forming an ether bond or an ester bond through etherification or esterification of a hydroxyl group-having resin with an alkyl halide or an acyl halide under a basic condition.

The protective group includes an alkyl group having from 1 to 20 carbon atoms (e.g., methyl, ethyl, propyl, butyl, hexyl, octyl, dodecyl, benzyl), an acyl group having from 1 to 10 carbon atoms (e.g., acetyl, propionyl, butyryl, octanoyl, benzoyl), an alkoxycarbonyl group having from 2 to 10 carbon atoms (e.g., methoxycarbonyl, ethoxycarbonyl, t-butoxycarbonyl), a carbamoyl group having from 1 to 10 carbon atoms (e.g., N,N-dimethylcarbamoyl, N,N-diethylcarbamoyl, morpholin-4-ylcarbonyl).

Especially preferred are an alkylcarbonyl group, an alkylsulfonyl group, and a substituted carbamoyl group. The alkyl group shown herein is a linear, branched or cyclic alkyl group which has from 1 to 20 carbon atoms and may have a substituent.

Preferred substituents are a halogen atom, a hydroxyl group, a cyano group, a nitro group and a phenyl group. The heat stability of the resin may be controlled by selecting the substituent on the carbon near to the carbonyl group or the sulfonyl group or by changing the number of the carbon atoms constituting the alkyl group.

Especially preferably, the alkylcarbonyl group is a methylcarbonyl group, an ethylcarbonyl group, an n-propylcarbonyl group, an i-propylcarbonyl group, an n-butylcarbonyl group, an octylcarbonyl group, a hexadecanylcarbonyl group, or a cyclohexylcarbonyl group.

Especially preferably, the alkylsulfonyl group is a methylsulfonyl group, an ethylsulfonyl group, an n-propylsulfonyl group, an i-propylsulfonyl group, an n-butylsulfonyl group, an i-butylsulfonyl group, an octylsulfonyl group, a hexadecanylsulfonyl group, or a cyclohexylsulfonyl group.

The substituted carbamoyl group is represented by —CO—NH—R or —CO—N(—R)$_2$, in which R represents an aliphatic group, a substituted aliphatic group, an aromatic group, a heteroaromatic group, a substituted aromatic group or a substituted heteroaromatic group. Especially preferred is —CO—N(—R)$_2$ In this, the aliphatic group may have a cyclic structure of a branched structure. The number of the carbon atoms constituting the aliphatic group is preferably from 1 to 15, more preferably from 1 to 10, most preferably from 1 to 6. The aliphatic group may have a substituent. Examples of the substituent are an aliphatic group having from 1 to 4 carbon atoms, an alkoxy group having from 1 to 4 carbon atoms, a cycloalkyl group having from 6 to 12 carbon atoms, a hydroxyl group, a carboxyl group, a cyano group, a nitro group. The number of the carbon atoms constituting the aromatic hydrocarbon group is preferably from 6 to 18. The aromatic hydrocarbon group may have a substituent. Examples of the substituent may be the same as those of the substituent in the substituted aromatic group and the substituted heteroaromatic group. The heterocyclic group preferably has a 5-membered or 6-membered hetero ring. The hetero ring may be condensed with any other hetero ring, aliphatic ring or aromatic ring. The hetero atom of the heterocyclic group is preferably a nitrogen atom, an oxygen atom or a sulfur atom. The heterocyclic group may have a substituent. Examples of the substituent in the heterocyclic group may be the same as those of the substituent in the substituted aromatic group and the substituted heteroaromatic group. Preferred examples of the substituted carbamoyl group are an N,N-dimethylcarbamoyl group, an N,N-diethylcarbamoyl group, an N,N-dipropylcarbamoyl group, an N,N-dibutylcarbamoyl group, and an N,N-diphenylcarbamoyl group, to which, however, the invention should not be limited.

As the protective group, more preferred is a group capable of decomposing through the action of an acid thereon to generate an alkali-soluble group (hydroxyl group or carboxyl group) (acid-decomposing group), or a group capable of leaving through the action of an acid thereon to generate a hydroxyl group on the side of the resin.

A preferred acid-decomposing group includes an acetal group and an ester group represented by the following formulae:

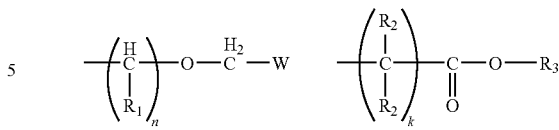

In the above acetal group, $R_1$ represents an alkyl group having from 1 to 4 carbon atoms; W represents a linear, branched or cyclic alkyl group having from 1 to 10 carbon atoms; n indicates an integer of from 1 to 4. In the above acetal group, W is preferably a linear, branched or cyclic alkyl group having from 1 to 6 carbon atoms, and n is 1 or 2.

The acetal group includes, for example, the following structures.

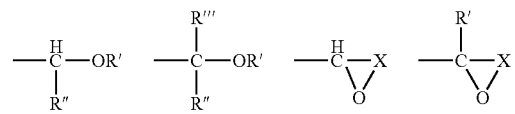

In the formulae, R', R" and R''' each independently represent an alkyl group having at most 5 carbon atoms; X represents a divalent alkylene group having at least 3 (and preferably at most 20) carbon atoms (optionally having a side branch).

Specific examples of the acetal group are an alkoxyalkyl group such as a methoxymethyl group, an ethoxyethyl group; and a tetrahydropyranyl group, a tetrahydrofuranyl group, an alkoxy-substituted tetrahydropyranyl group, an alkoxy-substituted tetrahydrofuranyl group.

In the above ester group, $R_2$ independently represents a hydrogen atom or an alkyl group having from 1 to 10 carbon atoms; k indicates an integer of from 0 to 4; $R_3$ represents a branched or cyclic tertiary alkyl group. In the ester group, k is preferably 0 or 1. The number of the carbon atoms constituting $R_3$ preferably falls within a range of from 4 to 15, more preferably from 4 to 13. Specific examples of $R_3$ are a t-butyl group, a t-amyl group, a 1-methylcyclopentyl group, a 1-ethylcyclopentyl group, a 1-ethylcyclohexyl group.

The group that leaves though the action of an acid thereon further includes an alkylsilyl group (preferably having from 1 to 20 carbon atoms, such as methylsilyl, ethylsilyl).

Preferably, the resin in the invention is one produced by protecting a non-protected resin not having G, of which the dissolution speed in an aqueous solution of 2.38% by mass of tetramethylammonium hydroxide (TMAH) (23° C.) is at least 0.1 μm/sec. Also preferably, the protected resin is so controlled as to have a dissolution speed in an aqueous 2.38 mas. % TMAH solution of at most 0.04 μm/sec.

Regarding the concrete degree of protection, it is desirable that from 0.5 mol % to 50 mol % of all the hydroxyl groups in the resin are protected, more preferably from 1 mol % to 40 mol %, even more preferably from 3 mol % to 30 mol % thereof are protected. When the degree of protection is too high, it is unfavorable as being problematic in that the adhesiveness to substrate may lower and the film mass reduction during curing may increase.

(B) Photosensitive Agent:

The photosensitive agent in the invention is meant to indicate a compound that imparts the function of forming an image through photoexposure to the resin composition and/or a compound that triggers the function. Concretely, it includes a compound capable of generating an acid through photoexposure (photoacid generator), a photosensitive quinonediazide compound, dihydropyridine compound. Two or more of these photosensitive agents may be combined for use herein. For sensitivity control, a sensitizer may be combined with the photosensitive agent. Preferably, the photosensitive agent is a photoacid generator and a photosensitive naphthoquinonediazide.

(B1) Quinonediazide Photosensitive Agent:

An o-quinonediazide photosensitive agent may be obtained, for example, through condensation of an o-quinonediazide-sulfonyl chloride and a hydroxy compound and/or an amino compound in the presence of a dehydrochlorinating agent.

The o-quinonediazide-sulfonyl chloride includes, for example, benzoquinone-1,2-diazide-4-sulfonyl chloride, naphthoquinone-1,2-diazide-5-sulfonyl chloride, naphthoquinone-1,2-diazide-4-sulfonyl chloride; but from the viewpoint of the sensitivity, preferred is use of naphthoquinone-1,2-diazide-4-sulfonyl chloride.

The hydroxy compound includes, for example, hydroquinone, resorcinol, pyrogallol, bisphenol A, bis (4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno [2,1-a]indene, tris(4-hydroxyphenyl)methane, tris(4-hydroxyphenyl)ethane.

The amino compound includes, for example, p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 44,'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis (4-amino-3-hydroxyphenyl)sulfone, bis(3-amino-4-hydroxyphenyl)hexafluoropropane, bis(4-amino-3-hydroxyphenyl) hexafluoropropane.

O-quinonediazide-sulfonyl chloride and a hydroxy compound and/or an amino compound are preferably so blended that the total of the hydroxy group and the amino group could be from 0.5 to 1 equivalent relative to 1 mol of o-quinonediazide-sulfonyl chloride. A preferred ratio of the dehydrochlorinating and o-quinonediazide-sulfonyl chloride is within a range of from 1/1 to 1/0.9. The reaction temperature is preferably from 0 to 40° C., and the reaction time is preferably from 1 to 24 hours.

The reaction solvent includes dioxane, 1,3-dioxolane, acetone, methyl ethyl ketone, tetrahydrofuran, chloroform, N-methylpyrrolidone. The dehydrochlorinating agent includes sodium carbonate, sodium hydroxide, sodium hydrogencarbonate, potassium carbonate, potassium hydroxide, trimethylamine, triethylamine, pyridine, 4-dimethylaminopyridine.

In the photosensitive resin composition of the invention, the amount of the quinonediazide photosensitive agent is preferably from 5 to 50 parts by mass relative to 100 parts by mass of the total resin amount, more preferably from 8 to 20 parts by mass, from the viewpoint of the dissolution speed difference between the exposed part and the non-exposed part and the sensitivity latitude range.

The amount of the other photosensitive agent than the quinonediazide photosensitive agent in the composition is preferably from 0.1 to 15 parts by mass relative to 100 parts by mass of the total resin amount, more preferably from 0.5 to 10 parts by mass.

The quinonediazide photosensitive agent includes, for example, compounds represented by the following structural formulae:

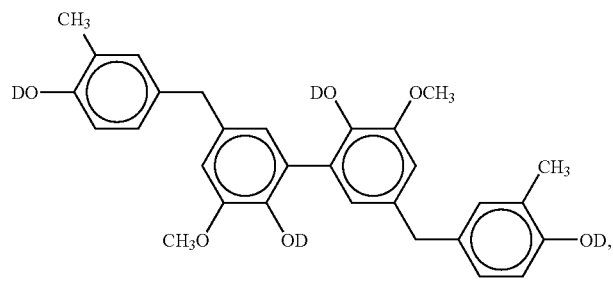

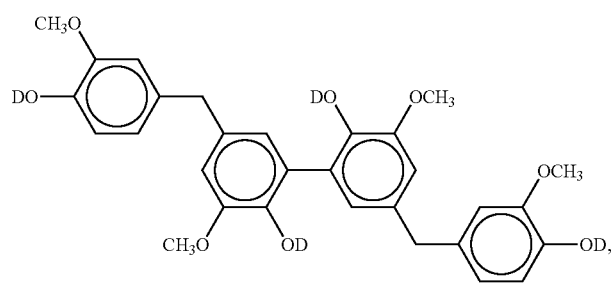

-continued
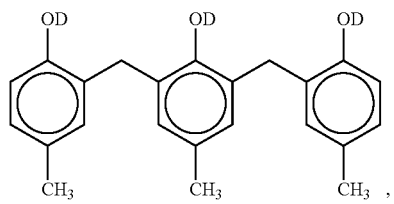
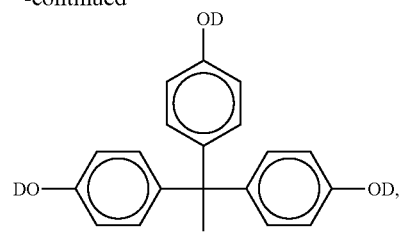
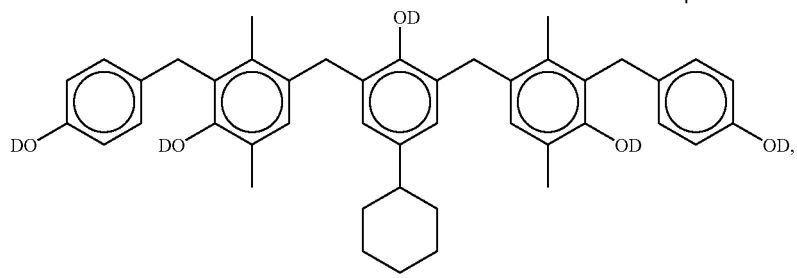
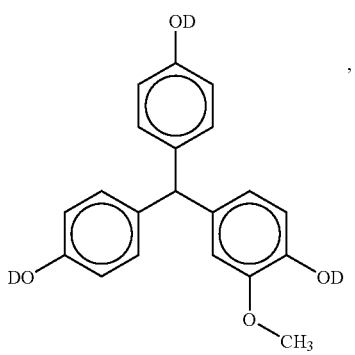
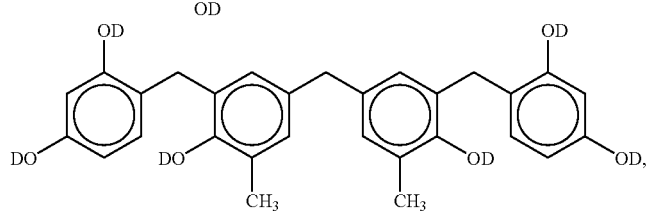
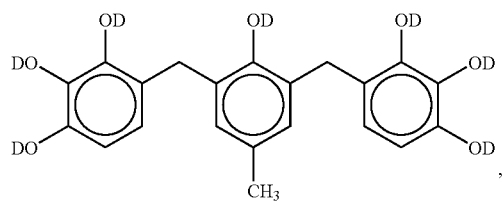
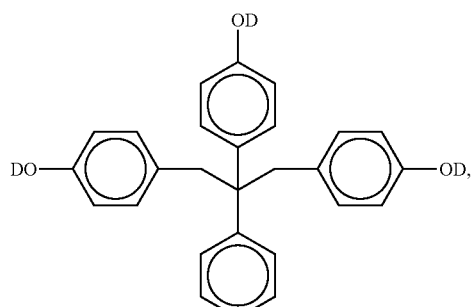
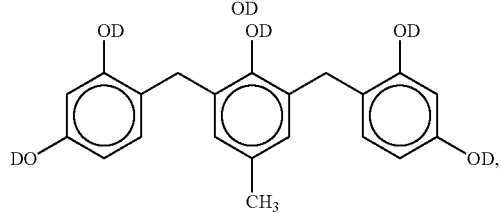
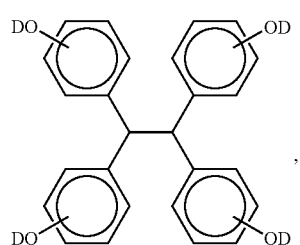

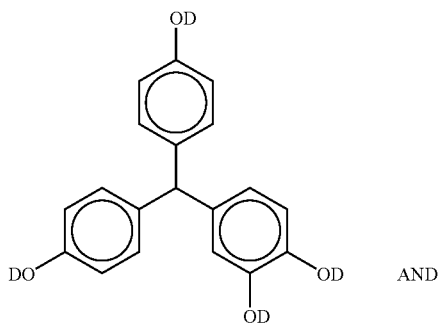

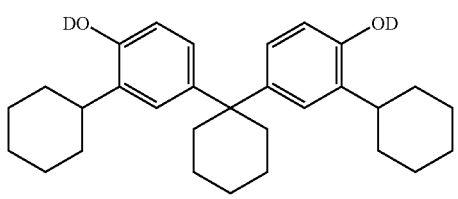

(BP-1)

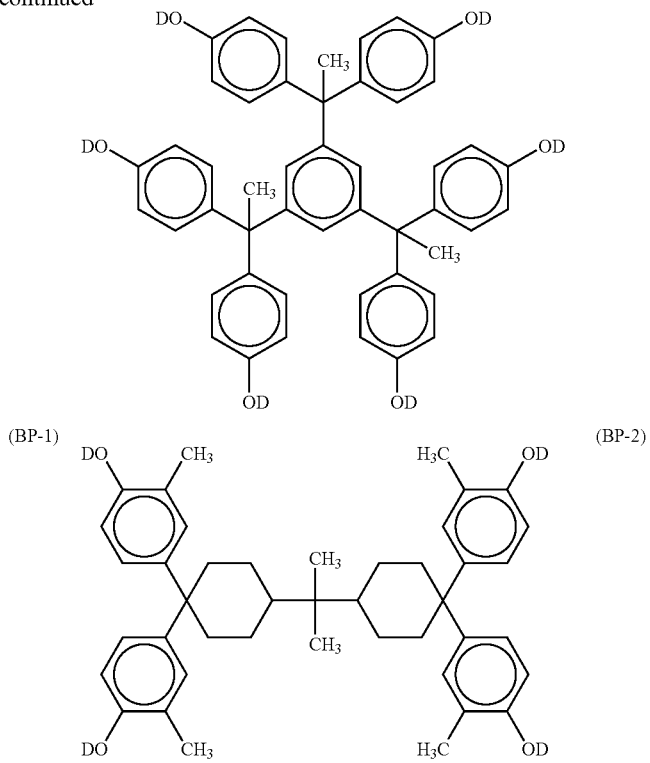

(BP-2)

In these formulae, D independently represents any of H or the following groups:

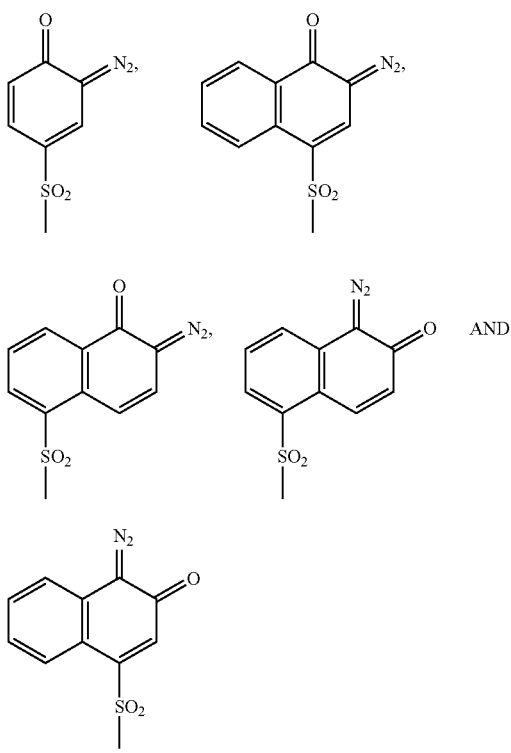

However, in each compound, at least one D should be the above-mentioned quinonediazide group.

The quinonediazide photosensitive agent may be a commercial product or may be produced according to a known method.

(B2) Photoacid Generator:

As the photoacid generator, herein usable are photocationic polymerization photoinitiators, photoradical polymerization photoinitiators, photodecoloring agents of dyes, photodiscoloring agents, known compounds used in microresists that generate acids through irradiation with active rays or radiations, and their mixtures. These may be suitably selected for the photoacid generator.

For example, there may be mentioned diazonium salts, phosphonium salts, sulfonium salts, iodonium salts, imidosulfonates, oximesulfonates, diazosulfones, disulfones, o-nitrobenzyl sulfonates.

In addition, also usable herein are compounds produced by introducing a group or a compound capable of generating an acid through irradiation with active rays or radiations, into the main chain or the side branch of a resin, for example, the compounds described in U.S. Pat. No. 3,849,137, German Patent 3914407, JP-A 63-26653, 55-164824, 62-69263, 63-146038, 63-163452, 62-153853, 63-146029.

Further, the compounds that generate acid by light, described in U.S. Pat. No. 3,779,778 and EP 126,712 are also usable.

Of the compounds that generate acid through irradiation with active rays or radiation, preferred are those of the following general formulae (ZI), (ZII) and (ZIII):

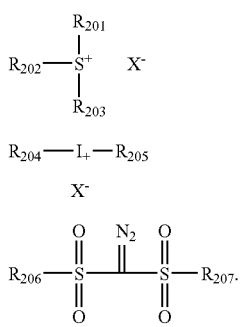

In formula (ZI), $R_{201}$, $R_{202}$ and $R_{203}$ each independently represent an organic group.

$X^-$ represents a non-nucleophilic anion, and is preferably a sulfonate anion, a carbonate anion, a bis(alkylsulfonyl)amide anion, a tris(alkylsulfonyl)methide anion, $BF_4^-$, $PF_6^-$ or $SbF_6^-$. Preferably, it is a carbon atom-containing organic anion.

Preferred organic anions are represented by the following general formulae:

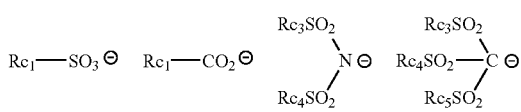

In the above formulae, $R_{c1}$ represents an organic group.

The organic group of $R_{c1}$ includes those having from 1 to 30 carbon atoms, and is preferably an alkyl group, cycloalkyl group or aryl group which may be substituted, or a group formed by bonding these via a single bond or via a linking group such as —O—, —CO$_2$—, —S—, —SO$_3$—, —SO$_2$N(Rd$_1$)-.

$R_{d1}$ represents a hydrogen atom or an alkyl group.

$R_{c3}$, $R_{c4}$ and $R_{c5}$ each independently represent an organic group.

The organic group for $R_{c3}$, $R_{c4}$ and $R_{c5}$, referred to are those mentioned herein as a preferred organic group for $R_{c1}$. Preferably, the organic group is a perfluoroalkyl group having from 1 to 4 carbon atoms.

$R_{c3}$ and $R_{c4}$ may bond to each other to form a ring.

The group to be formed by $R_{c3}$ and $R_{c4}$ bonding to each other includes an alkylene group, a cycloalkylene group, an arylene group. Preferred is a perfluoroalkylene group having from 2 to 4 carbon atoms.

The organic group for $R_{c1}$ and $R_{c3}$ to $R_{c5}$ is preferably an alkyl group substituted at the 1-position thereof with a fluorine atom or a fluoroalkyl group, or a phenyl group substituted with a fluorine atom or a fluoroalkyl group. Having a fluorine atom or a fluoroalkyl group, the acidity of the acid generated by the compound through irradiation with light may increase, and the sensitivity of the compound thereby increases. $R_{c3}$ and $R_{c4}$ bonding to each other to form a ring is also favorable since the acidity of the acid generated through irradiation with light may increase and the sensitivity also increases.

In formula (ZI), the number of the carbon atoms constituting the organic group for $R_{201}$, $R_{202}$ and $R_{203}$ may be generally from 1 to 30, preferably from 1 to 20.

Two of $R_{201}$ to $R_{203}$ may bond to each other to form a cyclic structure, which may have an oxygen atom, a sulfur atom, an ester bond, an amide bond or a carbonyl group in the ring. The group to be formed by two of $R_{201}$ to $R_{203}$ bonding to each other may be an alkylene group (e.g., butylene group, pentylene group).

Of the compounds that generate acid through irradiation with active rays or radiations, further preferred are those represented by the following general formulae (ZIV), (ZV) and (ZVI):

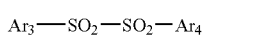

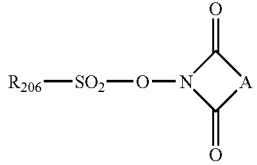

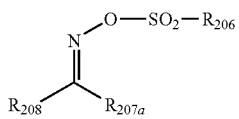

In formulae (ZIV) to (ZVI), $Ar_3$ and $Ar_4$ each independently represent an aryl group.

$R_{206}$ represents an alkyl group, a cycloalkyl group or an aryl group.

$R_{207a}$ and $R_{208}$ each independently represent an alkyl group, a cycloalkyl group, an aryl group or an electron-attracting group. $R_{207a}$ is preferably an aryl group. $R_{208}$ is preferably an electron-attracting group, more preferably a cyano group or a fluoroalkyl group.

A represents an alkylene group, an alkenylene group or an arylene group.

In the photosensitive resin composition of the invention, the amount of the photoacid generator is preferably from 1 to 30 parts by mass relative to 100 parts by mass of the total resin amount, more preferably from 3 to 20 parts by mass.

One or more such photoacid generators may be used either singly or as combined. In case where two or more photoacid generators are combined for use herein, they are preferably so combined that they may generate two organic acids that differ in the number of all the constitutive atoms except hydrogen atoms by at least 2.

Of the compounds that generate acid through irradiation with active rays or radiations, preferred examples are oxime-sulfonates (ZVI).

Specific examples of the preferred oximesulfonate compounds are the following:

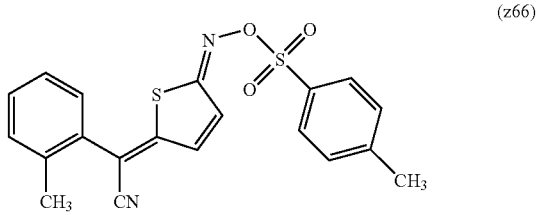

-continued

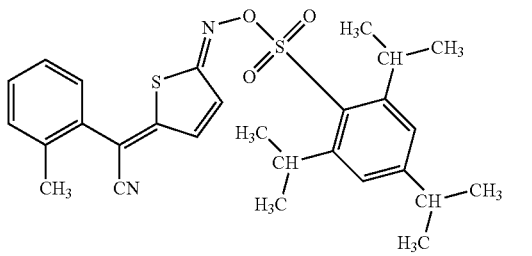
(z67)

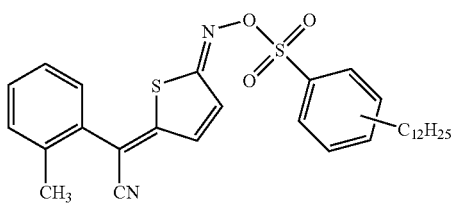
(z68)

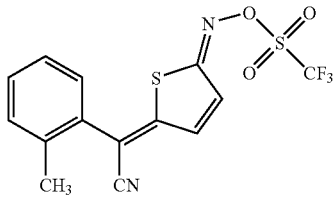
(z69)

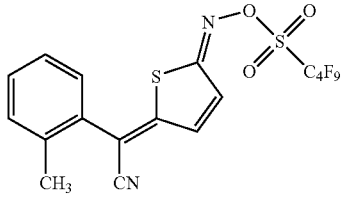
(z70)

Triarylsulfonium salts having a specific substituent are also preferred examples. Especially preferably, they are further combined with a sensitizer.

If desired, two or more different types of these compounds may be combined for use herein.

As the specific substituent, at least one aryl group of the triarylsulfonium salt is preferably substituted with an electron-attracting group; and more preferably, the sum total of the Hammet values of the substituents bonding to the aryl skeleton is larger than 0.18.

The electron-attracting group as referred to herein means a substituent having a Hammet value (Hammet substituent constant ρ) of more than 0. In the invention, from the viewpoint of increasing the sensitivity of the composition, it is desirable that the sum total of the Hammet values of the substituents bonding to the aryl skeleton in the specific photoacid generator is at least 0.18, more preferably at least 0.46, even more preferably at least 0.60.

The Hammet value indicates the degree of electron attractivity of the cation having a triarylsulfonium salt structure; and from the viewpoint of increasing the sensitivity of the composition, the uppermost limit of the Hammet value is not specifically defined, but from the viewpoint of the reactivity and the stability of the composition, the Hammet value is preferably from more than 0.46 to less than 4.0, more preferably from more than 0.50 to less than 3.5, even more preferably from more than 0.60 to less than 3.0.

For the Hammet value in the invention, employed are the numerical data in Naoki Inamoto's Chemical Seminar 10, Hammet Rule—Structure and Reactivity—(1983, issued by Maruzen).

The electron-attracting group to be introduced into the aryl skeleton includes a trifluoromethyl group, a halogen atom, an ester group, a sulfoxide group, a cyano group, an amide group, a carboxyl group, a carbonyl group. The Hammet values of these substituents are shown below. Trifluoromethyl group (—$CF_3$, m: 0.43, p: 0.54), halogen atom [e.g., —F (m: 0.34, p: 0.06), —Cl (m: 0.37, p: 0.23), —Br (m: 0.39, p: 0.23), —I (m: 0.35, p: 0.18)], ester group (e.g., —$COCH_3$, o: 0.37, p: 0.45), sulfoxide group (e.g., —$SOCH_3$, m: 0.52, p: 0.45), cyano group (—CN, m: 0.56, p: 0.66), amide group (e.g., —$NHCOCH_3$, m: 0.21, p: 0.00), carboxyl group (—COOH, m: 0.37, p: 0.45), carbonyl group (—CHO, m: 0.36, p: 0.43). The parenthesized data mean the position of the substituent introduced in the aryl skeleton, and the Hammet value thereof. (m: 0.50) means that the substituent introduced in the meta-position has a Hammet value of 0.50.

Of those substituents, preferred are nonionic substituents such as halogen atom and a halogenoalkyl group, from the viewpoint of the hydrophilicity thereof; and more preferred is —CL from the viewpoint of the reactivity. From the viewpoint of the property of imparting hydrophilicity, preferred are —F, —$CF_3$, —Cl, —Br.

These substituents may be introduced into any one of the three aryl skeletons of the triarylsulfonium salt structure, or may be introduced into two or more of them. One or more substituents may be introduced into each of the three aryl skeletons. In the invention, the sum total of the Hammet values of the substituents introduced into these aryl skeletons is preferably more than 0.18, more preferably more than 0.46. The number of the substituents to be introduced is not defined. For example, only one substituent having an especially large Hammet value (for example, having a Hammet value of more than 0.46 by itself) may be introduced into only one aryl skeleton of the triarylsulfonium salt structure. On the other hand, for example, plural substituents may be introduced in such a manner that the total of their Hammet values could be more than 0.46.

As in the above, the Hammet value of the substituent varies, depending on the position at which it is introduced; and therefore, the sum total of the Hammet values in the specific photoacid generator of the invention may be determined depending on the type of the substituent, the position at which the substituent is introduced and the number of the substituents introduced.

The Hammet value is represented generally at an m-position and a p-position; but in the invention, as an index of the electron attractivity, the substituent effect at an o-position is considered the same as that at a p-position. The preferred position for substitution is m- and p-positions from the viewpoint of production, and a p-position is the most preferred.

In the invention, preferred is a sulfonium salt tri- or more multi-substituted with halogen atoms; and most preferred is a sulfonium salt tri-substituted with chlorines. Concretely, preferred is a triarylsulfonium salt structure in which every of the three aryl skeletons is substituted with a halogen atom, more preferably with —Cl, even more preferably, with —Cl at the p-position.

The sulfonate anion that the triarylsulfonium salts in the composition of the invention has includes, for example, an arylsulfonate anion, an alkanesulfonate anion. Preferred is an anion substituted with a fluorine atom or a fluorine atom-having organic group.

The compound having a triarylsulfonium salt structure may be readily produced, for example, according to the methods described in J. Am. Chem. Soc., Vol. 112 (16), 1990, pp. 6004-6015; J. Org. Chem., 1988, pp. 5571-5573; WO02/081439A1, or EP 1113005.
Specific examples are mentioned below, to which, however, the invention should not be limited.
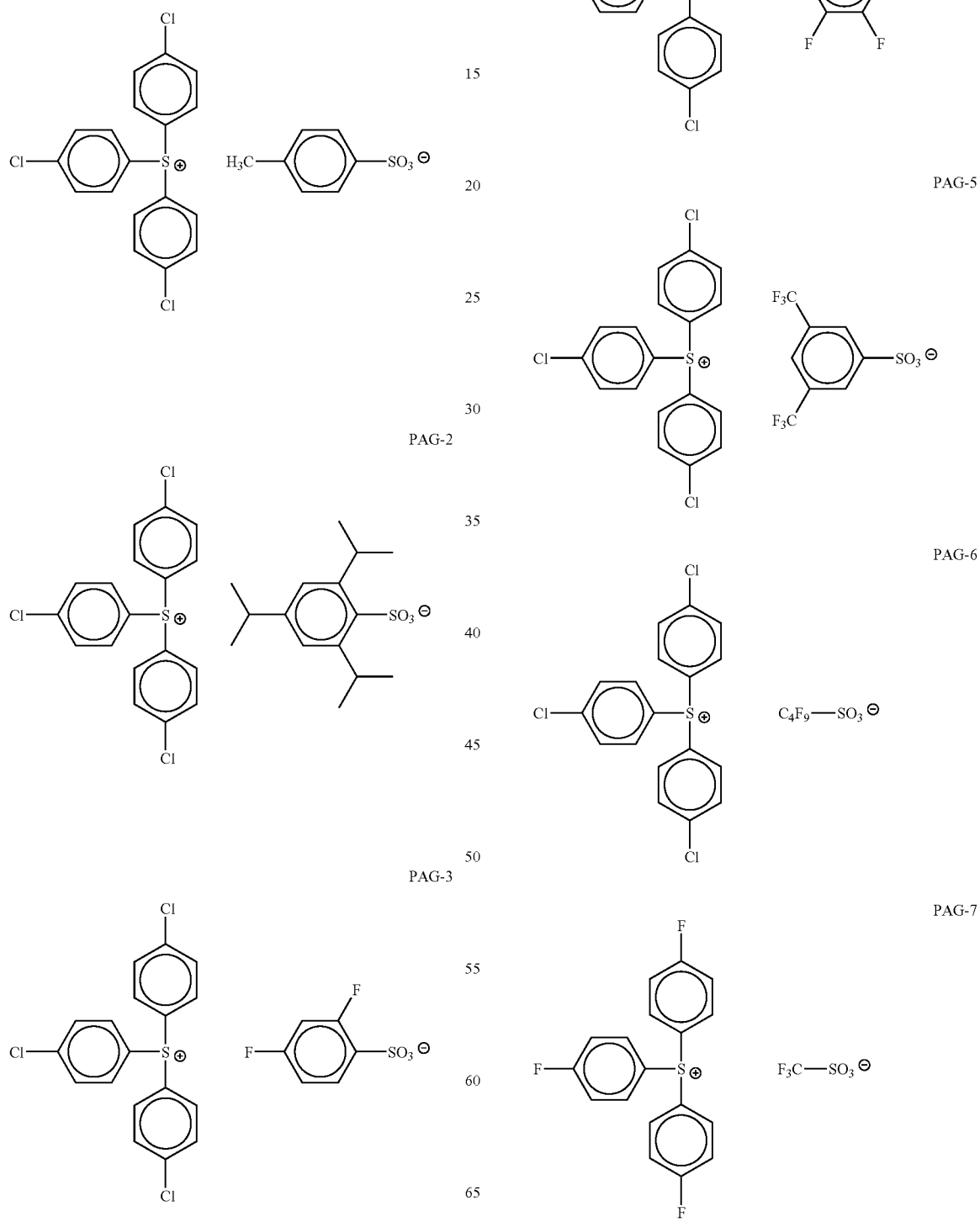

-continued
PAG-8
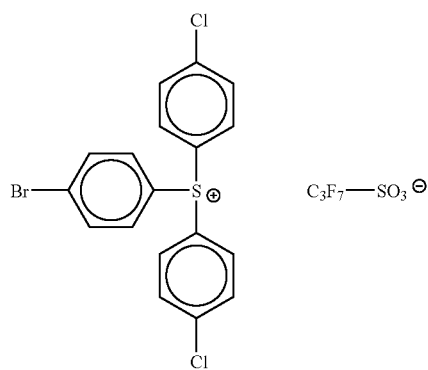
PAG-9
PAG-10
PAG-11
-continued
PAG-12
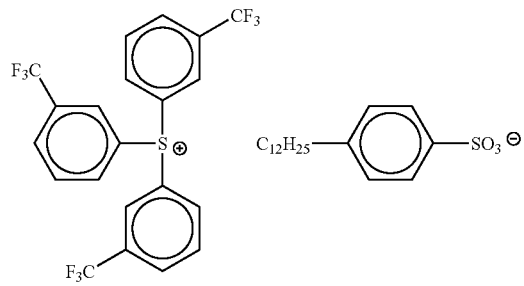
PAG-13
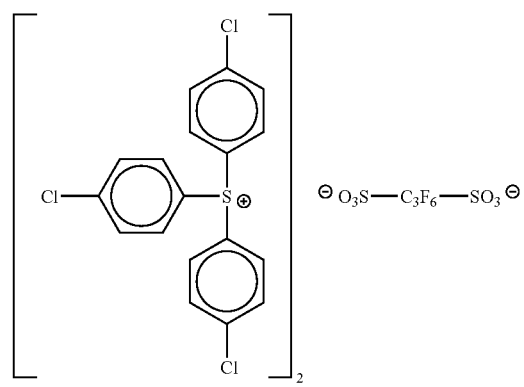
PAG-14
PAG-15
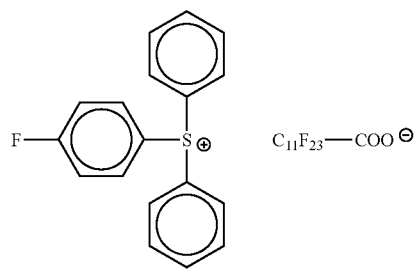

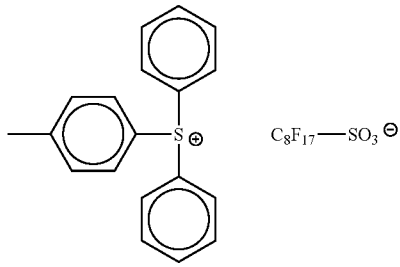

PAG-16

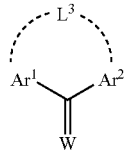

(X)

In formula (X), $Ar^1$ and $Ar^2$ each independently represent an aryl group, and they bond to each other via the bond of $-L^3-$. In this, $L^3$ represents —O— or —S—. W has the same meaning as in formula (IX).

(B3) Sensitizer:

A sensitizer capable of absorbing active rays or radiations to promote the decomposition of the above-mentioned sulfonium salt may be added to the composition of the invention. The sensitizer absorbs active rays or radiations to be in an electron-excited state. The sensitizer in an electron-excited state is contacted with sulfonium, thereby causing the action of electron transfer, energy transfer and heat generation. Accordingly, the polymerization initiator undergoes chemical reaction and is decomposed to generate a radical, an acid or a base.

Preferred examples of the sensitizer are those that belong to the following compounds and have an absorption wavelength within a range of from 350 nm to 450 nm.

Polynuclear aromatics (e.g., pyrene, perylene, triphenylene, anthracene), xanthenes (e.g., fluorescein, eosine, erythrosine, Rhodamine B, rose bengal), cyanines (e.g., thiacarbocyanine, oxacarbocyanine), merocyanines (e.g., merocyanine, carbomerocyanine), thiazines (e.g., thionin, methylene blue, toluidine blue), acridines (e.g., acridine orange, chloroflavin, acryflavin), anthraquinones (e.g., anthraquinone), squaliums (e.g., squalium), coumarins (e.g., 7-diethylamino-4-methylcoumarin).

More preferred examples of the sensitizer are compounds represented by the following formulae (IX) to (XIV):

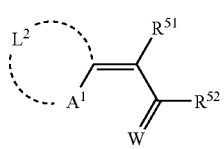

(IX)

In formula (IX), $A^1$ represents a sulfur atom or $NR^{50}$; $R^{50}$ represents an alkyl group or an aryl group; $L^2$ represents a non-metallic atomic group that forms a basic nucleus of a dye along with the adjacent $A^1$ and the adjacent carbon atom; $R^{51}$ and $R^{52}$ each independently represent a hydrogen atom or a monovalent non-metallic atomic group; $R^{51}$ and $R^{52}$ may bond to each other to form an acidic nucleus of a dye; W represents an oxygen atom or a sulfur atom.

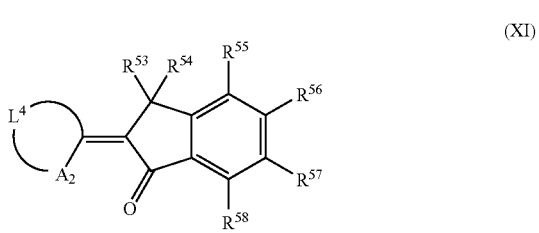

(XI)

In formula (XI), $A_2$ represents a sulfur atom or $NR^{59}$; L4 represents a non-metallic atomic group that forms a basic nucleus of a dye along with the adjacent $A_2$ and carbon atom; $R^{53}$, $R^{54}$, $R^{55}$, $R^{56}$, $R^{57}$ and $R^{58}$ each independently represent a monovalent non-metallic atomic group; $R^{59}$ represents an alkyl group or an aryl group.

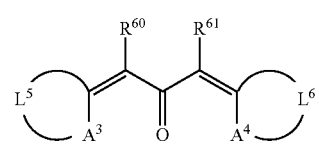

(XII)

In formula (XII), $A^3$ and $A^4$ each independently represent —S—, —$NR^{62}$— or —$NR^{63}$—; $R^{62}$ and $R^{63}$ each independently represent a substituted or unsubstituted alkyl group, or a substituted or unsubstituted aryl group; $L^5$ and $L^6$ each independently represent a non-metallic atomic group that forms a basic nucleus of a dye along with the adjacent $A^3$ or $A^4$ and the adjacent carbon atom, $R^{60}$ and $R^{61}$ each independently represent a hydrogen atom, or a monovalent non-metallic atomic group, or as taken together, they may form an aliphatic or aromatic ring.

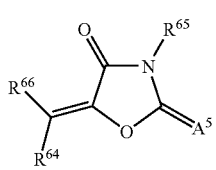

(XIII)

In formula (XIII), $R^{66}$ represents an aromatic ring or hetero ring which may have a substituent; $A^5$ represents an oxygen atom, a sulfur atom or —$NR^{67}$—; $R^{64}$, $R^{65}$ and $R^{67}$ each independently represent a hydrogen atom or a monovalent non-metallic atomic group; $R^{67}$ and $R^{64}$, and $R^{65}$ and $R^{67}$ may bond to each other to form an aliphatic or aromatic ring.

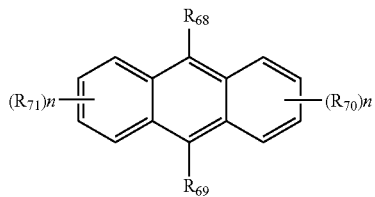

(XIV)

In formula (XIV), $R_{68}$ and $R_{69}$ each independently represent a hydrogen atom or a monovalent non-metallic atomic group. $R_{70}$ and $R_{71}$ each independently represent a hydrogen atom or a monovalent non-metallic atomic group; n indicates an integer of from 0 to 4. When n is 2 or more, $R_{70}$ and $R_{71}$ may bond to each other to form an aliphatic or aromatic ring.

As the sensitizer, especially preferred are anthracene derivatives.

Preferred examples of the compounds represented by formulae (IX) to (XIV) are the following (C-1) to (C-26), to which, however, the invention should not be limited.

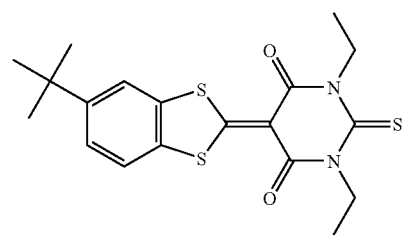

(C-1)

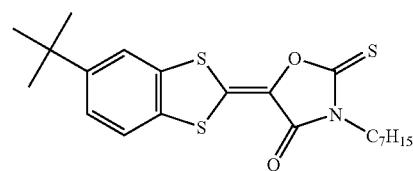

(C-2)

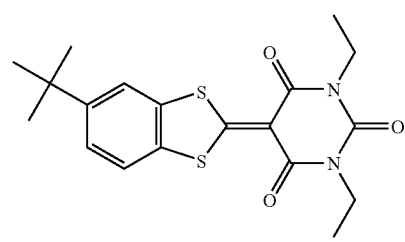

(C-3)

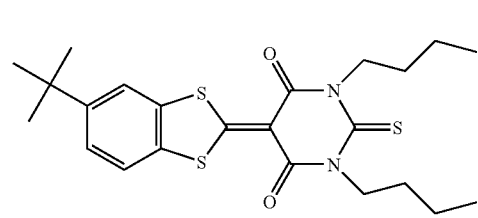

(C-4)

-continued

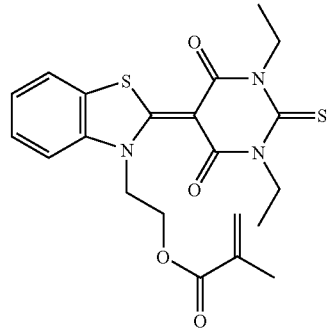

(C-5)

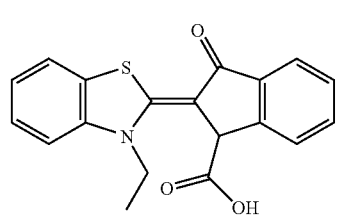

(C-6)

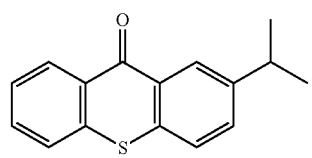

(C-7)

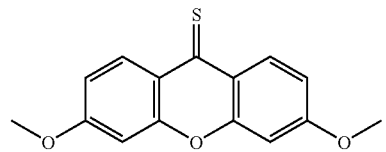

(C-8)

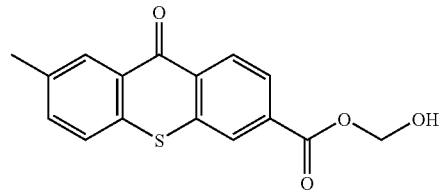

(C-9)

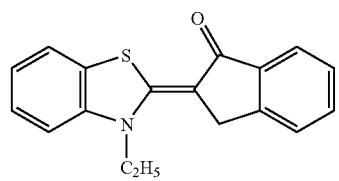

(C-10)

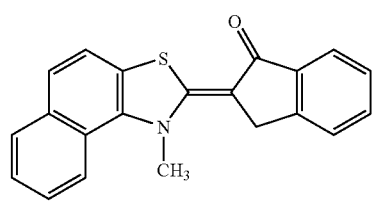

(C-11)

-continued
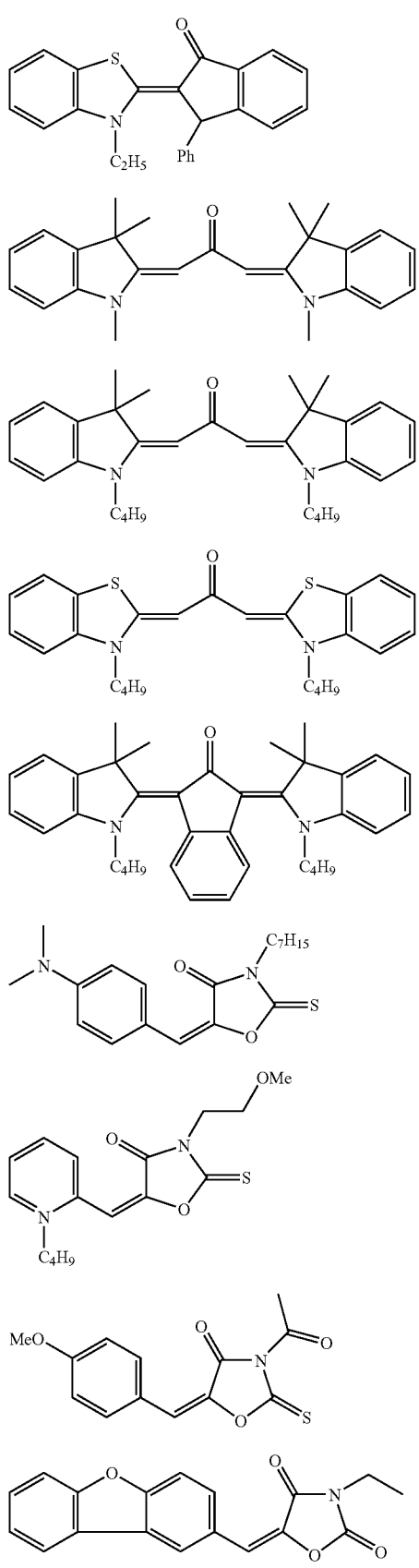
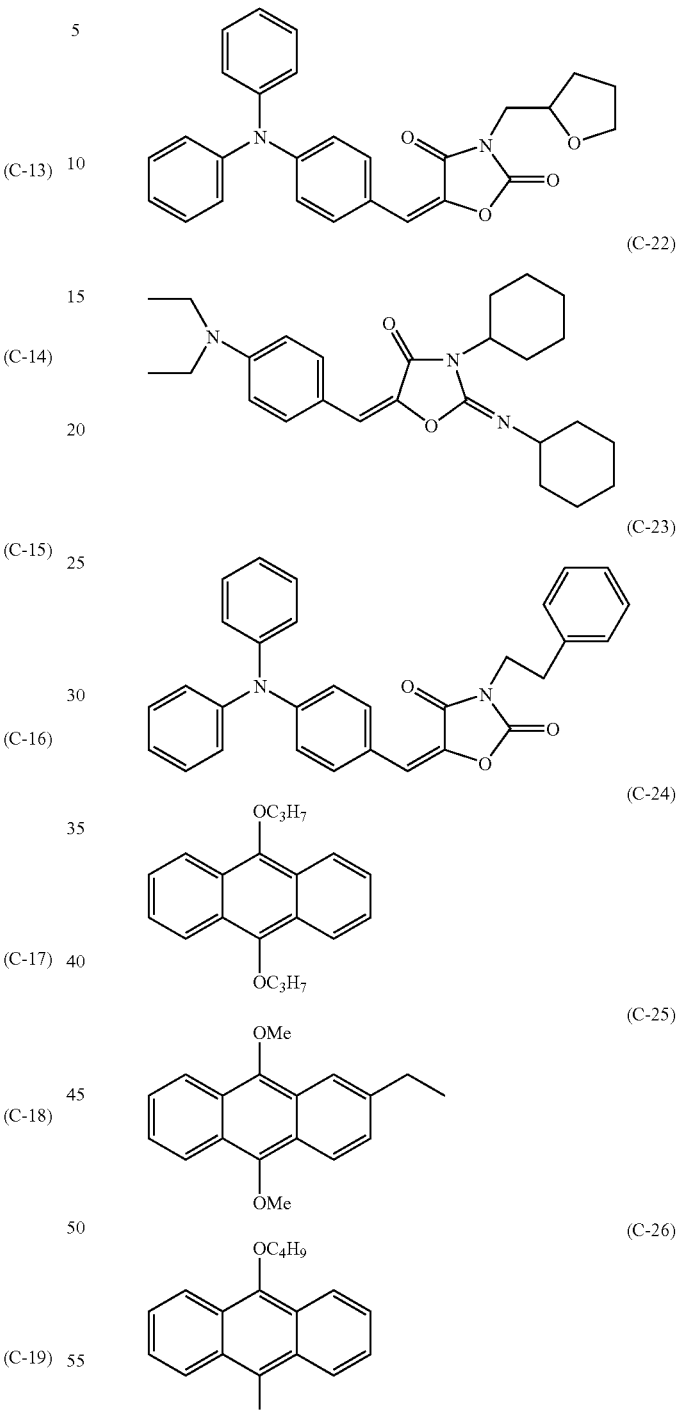
The above-mentioned sensitizers may be commercial products, or may be produced according to known production methods.
The amount of the sensitizer to be added is preferably from 20 to 200 parts by mass relative to 100 parts by mass of the photosensitive agent, more preferably from 30 to 150 parts by mass.

(C) Sulfonate Ester Compound:

A sulfonate ester is added to the composition of the invention. Preferably, a sulfonate ester represented by a general formula (2) is added to attain high-level heat resistance.

The molecular weight of the sulfonate ester is generally from 230 to 1000, preferably from 230 to 800.

A represents an h-valent linking group.

$R_0$ represents an alkyl group, an aryl group, an aralkyl group or a cyclic alkyl group.

$R_0'$ represents a hydrogen atom, an alkyl group or an aralkyl group.

h indicates from 2 to 8.

The linking group for A includes, for example, an alkylene group (e.g., methylene, ethylene, propylene), a cycloalkylene group (e.g., cyclohexylene, cyclopentylene), an arylene group (e.g., 1,2-phenylene, 1,3-phenylene, 1,4-phenylene, naphthylene), an ether group, a carbonyl group, an ester group, an amide group, or a combination of these groups. The number of the carbon atoms constituting the linking group of A may be from 1 to 15, preferably from 1 to 10, even more preferably from 1 to 6.

The alkyl group for $R_0$ and $R_0'$ is generally an alkyl group having from 1 to 20 carbon atoms, preferably an alkyl group having from 1 to 15 carbon atoms, more preferably an alkyl group having from 1 to 8 carbon atoms. Concretely, it includes methyl, ethyl, propyl, butyl, hexyl, octyl.

The aralkyl group for $R_0$ and $R_0'$ is an aralkyl group having from 7 to 25 carbon atoms, preferably an aralkyl group having from 7 to 20 carbon atoms, more preferably an aralkyl group having from 7 to 15 carbon atoms. Concretely, it includes benzyl, tolylmethyl, mesitylmethyl, phenethyl.

The cyclic alkyl group for $R_0$ is generally a cyclic alkyl group having from 3 to 20 carbon atoms, preferably a cyclic alkyl group having from 4 to 20 carbon atoms, more preferably a cyclic alkyl group having from 5 to 15 carbon atoms. Concretely, it includes cyclopentyl, cyclohexyl, norbornyl, camphoryl.

The linking group of A may further have a substituent. The substituent includes an alkyl group (an alkyl group having from 1 to 10 carbon atoms, concretely methyl, ethyl, propyl, butyl, hexyl, octyl), an aralkyl group (an aralkyl group having from 7 to 15 carbon atoms, concretely benzyl, tolylmethyl, mesitylmethyl, phenethyl), an aryl group (an aryl group having from 6 to 10 carbon atoms, concretely phenyl, tolyl, xylyl, mesityl, naphthyl), an alkoxy group (the alkyl group may be linear, branched or cyclic and may have from 1 to 10 carbon atoms, concretely, methoxy, ethoxy, linear or branched propoxy, linear or branched butoxy, linear or branched pentoxy, cyclopentyloxy, cyclohexyloxy), an aryloxy group (an aryloxy group having from 6 to 10 carbon atoms, concretely, phenoxy, tolyloxy, 1-naphthoxy), an alkylthio group (a linear, branched or cyclic alkylthio group having from 1 to 10 carbon atoms, concretely, methylthio, ethylthio, linear or branched propylthio, cyclopentylthio, cyclohexylthio), an arylthio group (an arylthio group having from 6 to 10 carbon atoms, concretely phenylthio, tolylthio, 1-naphthylthio), an acyloxy group (an acyloxy group having from 2 to 10 carbon atoms, concretely acetoxy, propanoyloxy, benzoyloxy), an alkoxycarbonyl group (an alkoxycarbonyl group having from 1 to 10 carbon atoms, concretely methoxycarbonyl, ethoxycarbonyl, linear or branched propoxycarbonyl, cyclopentyloxycarbonyl, cyclohexyloxycarbonyl).

In formula (2), $R_0$ is preferably an alkyl group or an aryl group. $R_0'$ is preferably a hydrogen atom or an alkyl group having from 1 to 6 carbon atoms, more preferably a hydrogen atom, a methyl group or an ethyl group, most preferably a hydrogen atom.

Specific examples of the sulfonate ester for use in the invention are the following compounds, to which, however, the invention should not be limited.

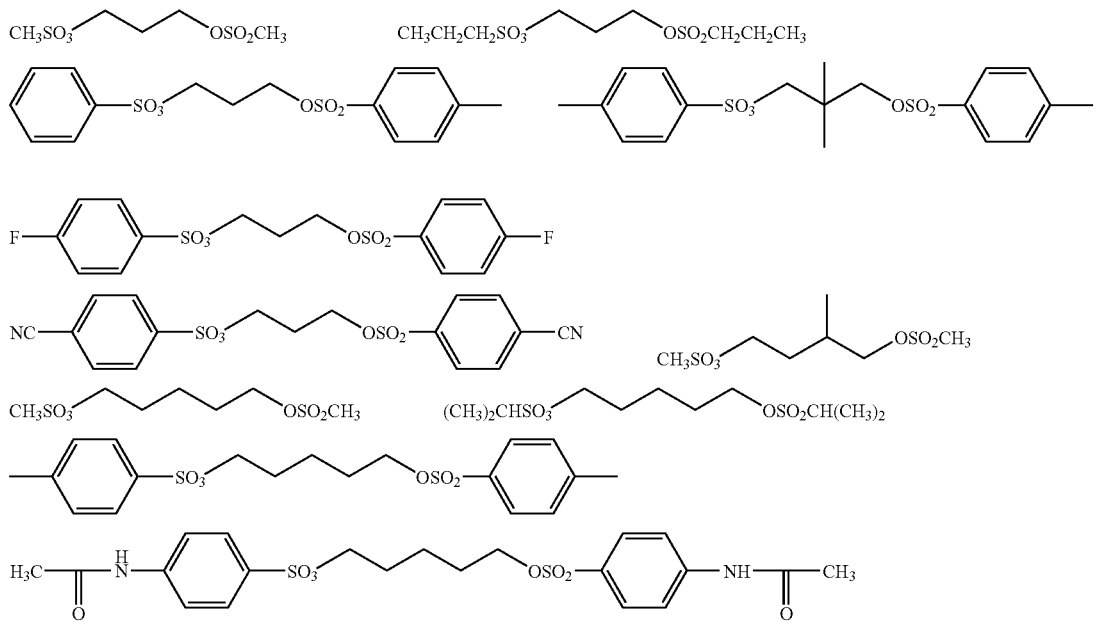

-continued

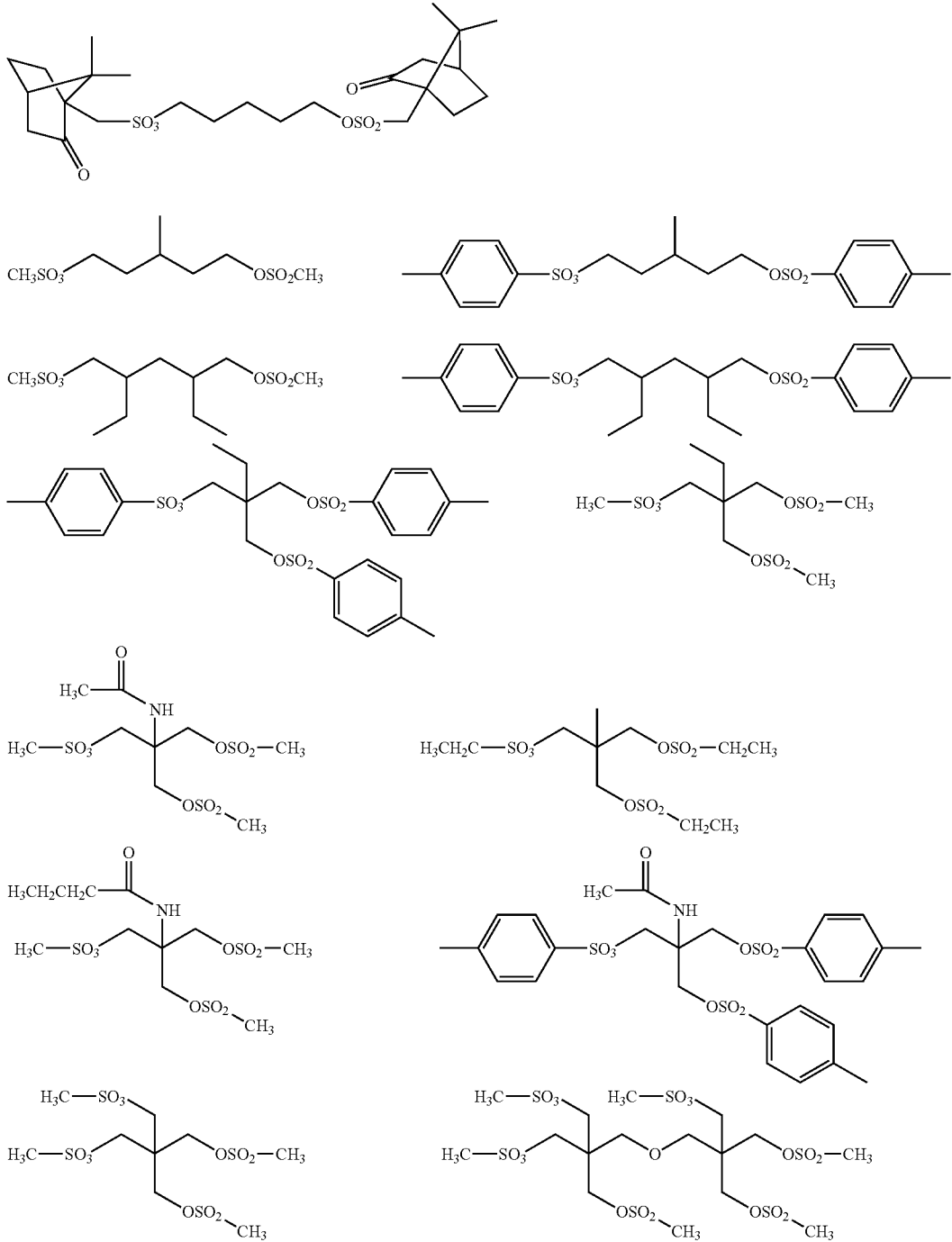

The sulfonate ester for use in the invention may be commercial products or may be produced according to known methods. The sulfonate ester for use in the invention may be produced, for example, by reacting a sulfinyl chloride or a sulfonic acid anhydride with a corresponding polyalcohol under a basic condition.

The amount of the sulfonate ester to be added to the composition of the invention is preferably from 1 to 20 parts by mass relative to 100 parts by mass of the whole resin in the composition, more preferably from 2 to 15 parts by mass.

(D) Compound having alkoxymethyl group or acyloxymethyl group:

A compound having an alkoxymethyl group or an acyloxymethyl group may be added to the composition of the invention. It is known that the compound can prevent a pattern from being fused or thermally shrunk during curing, not detracting from the lithography performance thereof. Unfortunately, however, when it is used in a low-temperature curing process, it has become known that the effect is insufficient though the reason is not clear, and the heat resistance of the cured film is not sufficient.

The present inventors have found that the combination of the compound with the above-mentioned sulfonate ester improves the heat resistance and further the chemical resistance of the cured film.

The number of the carbon atoms constituting the alkoxymethyl group or the acyloxymethyl group that the compound has is preferably from 2 to 5, more preferably 2 or 3. In particular, the alkoxymethyl preferably has 2 carbon atoms; and the acyloxymethyl group preferably has 3 carbon atoms.

The total number of the alkoxymethyl group and the acyloxymethyl group that the compound has is preferably from 1 to 10, more preferably from 2 to 8, even more preferably from 3 to 6.

The molecular weight of the compound is preferably at most 1500, more preferably from 180 to 1200.

Typical structures of the compound having an alkoxymethyl group or an acyloxymethyl group in the invention are those in which an alkoxymethyl group or an acyloxymethyl group directly bonds to the aromatic group, or bonds to N of the following urea structure, or bonds to triazine.

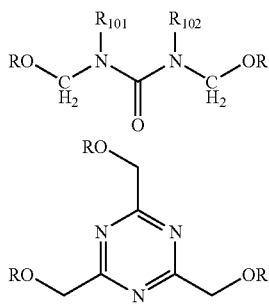

In the formulae, R represents an alkyl group having from 1 to 4 carbon atoms, or an acyl group having from 1 to 4 carbon atoms; $R_{101}$ and $R_{102}$ each represent a monovalent organic group; $R_{101}$ and $R_{102}$, taken together, may form a 5- to 8-membered ring.

The compounds in which an alkoxymethyl group or an acyloxymethyl group directly bonds to the aromatic group are, for example, those represented by the following general formulae:

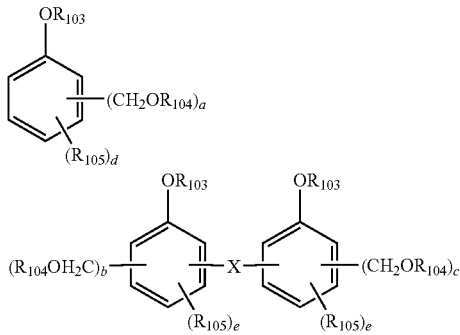

In the formulae, $R_{104}$ each independently represents an alkyl group or an acyl group; $R_{103}$ represents a hydrogen atom, an alkyl group, an alkenyl group, an aryl group, an aralkyl group, or a group that decomposes by the action of an acid to generate an alkali-soluble group.

$R_{105}$ each independently represents an alkyl group or an alkenyl group; a, b and c each independently indicate from 1 to 3; d is from 0 to 4; and e each independently indicates from 0 to 3.

X represents a single bond or a divalent organic group.

When X is a divalent organic group, the divalent organic group includes an alkylene group (e.g., methylene, ethylene, propylene), a cycloalkylene group (e.g., cyclohexylene, cyclopentylene), an arylene group (e.g., 1,2-phenylene, 1,3-phenylene, 1,4-phenylene, naphthylene), an ether group, a carbonyl group, an ester group, an amide group, and a combination of these groups. Preferably, X is a single bond or an alkylene group.

The group of $R_{103}$ that decomposes by the action of an acid to generate an alkali-soluble group is a group that decomposes by the action of an acid to generate an alkali-soluble group such as a hydroxyl group or a carboxyl group to the resin side; and for example, it includes a group that leaves by the action of an acid, or —C $(R^4)_2$—$COOR^5$ (where $R^4$ is a hydrogen atom or an alkyl group having from 1 to 4 carbon atoms, and $R^5$ is a group that leaves by the action of an acid).

Regarding the group that decomposes by the action of an acid to generate an alkali-soluble group, when $R_{103}$ is a group that leaves by the action of an acid, $R_{103}$ itself leaves by the action of an acid to generate —OH; or when $R_{103}$ is —$C(R^4)_2$—$COOR^5$, $R^5$ leaves by the action of an acid to generate —COOH.

Regarding the group that leaves by the action of an acid, referred to are those of the group G that leaves by the action of an acid in formula (1).

Examples of the compound having an alkoxymethyl group are mentioned below.

Examples of the compound having an acyloxymethyl group may be derived from the compounds mentioned below by changing the alkoxymethyl group therein to an acyloxymethyl group.

The compound having an alkoxymethyl group or an acyloxymethyl group in the molecule should not be limited to the compounds mentioned below.

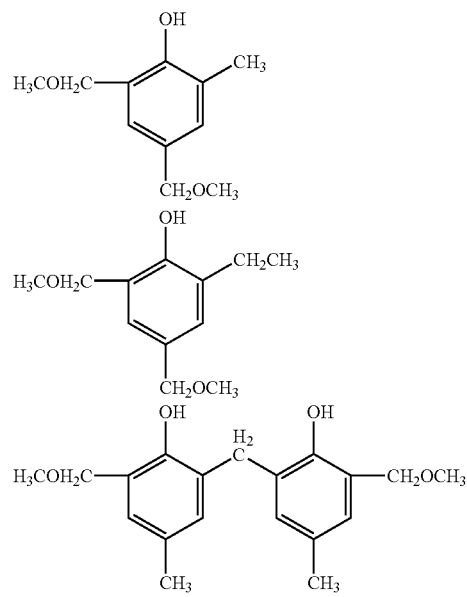

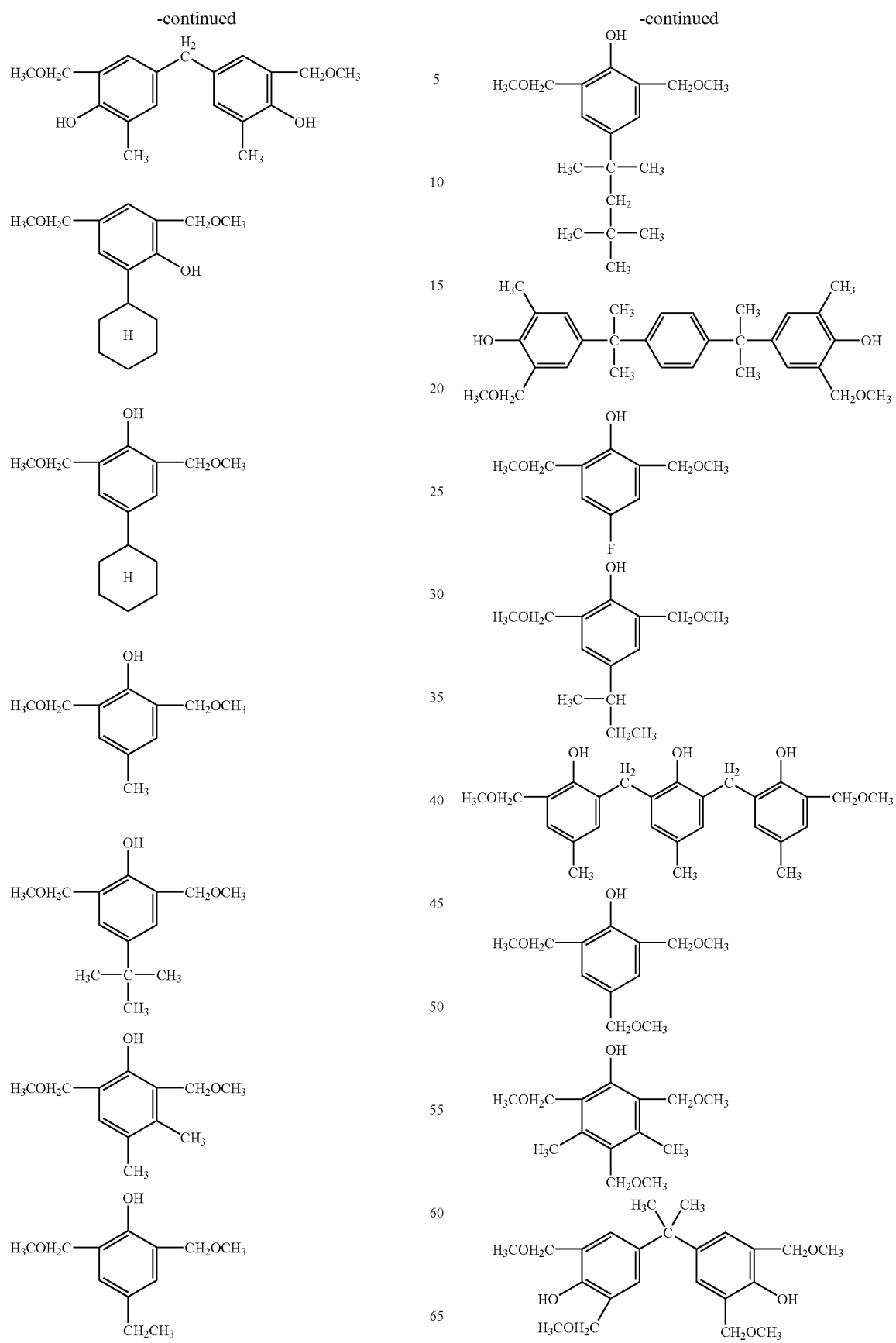

-continued
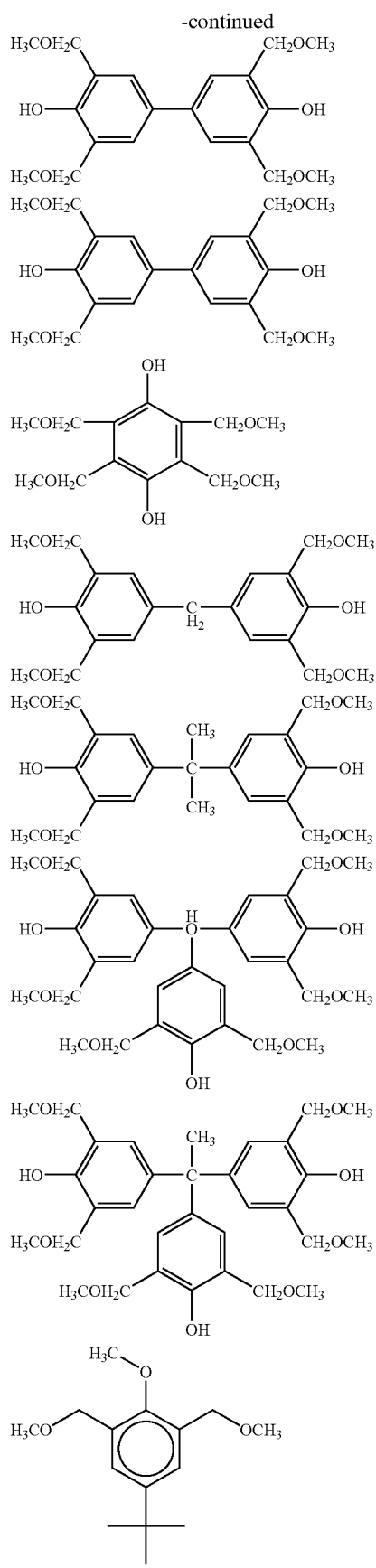
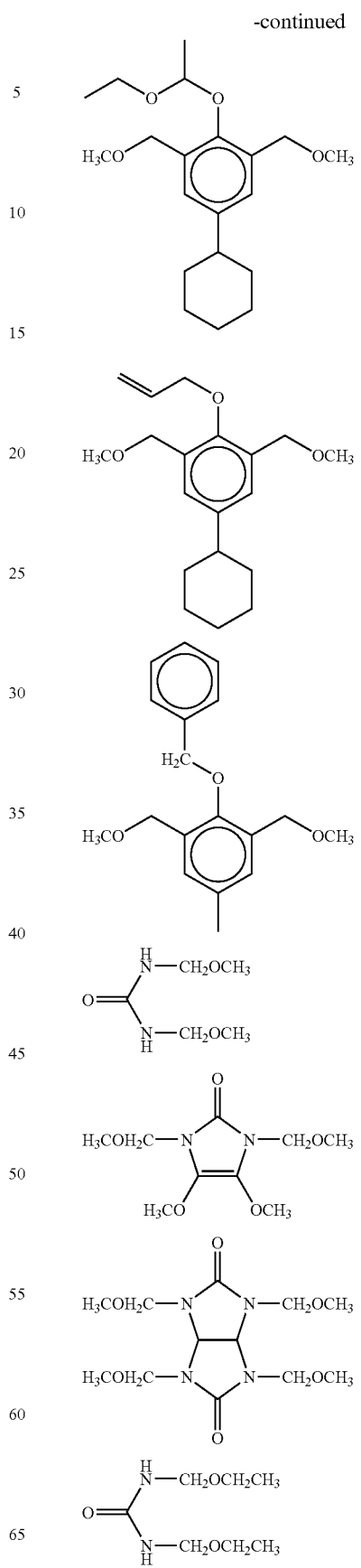

-continued

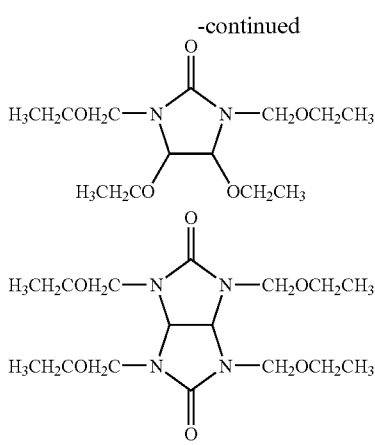

The compounds having at least one of an alkoxymethyl group and an acyloxymethyl group may be commercial products or may be produced according to known production methods.

From the viewpoint of the heat resistance, preferred are compounds in which the alkoxymethyl group or an acyloxymethyl group directly bonds to the aromatic group or to the triazine ring.

The amount of the compound to be added is preferably from 1 to 20 parts by weight relative to 100 parts by weight of the resin in the composition, more preferably from 3 to 15 parts by mass.

(E) Adhesion Promoter:

The positive photosensitive resin composition of the invention may contain, as added thereto if desired, an adhesion promoter for imparting adhesiveness to the composition, such as an organic silicon compound, a silane coupling agent or a leveling agent. Examples of the compounds are γ-aminopropyltrimethoxysilane, γ-aminopropyltriethoxysilane, vinyltriethoxysilane, γ-glycidoxypropyltriethoxysilane, γ-methacryloxypropyltrimethoxysilane, urea-propyltriethoxysilane, tris(acetylacetonato) aluminium, acetylacetonato-aluminium diisopropylate. In case where the adhesion promoter is added, its amount is preferably from 0.1 to 20 parts by mass relative to 100 parts by mass of the resin in the composition, more preferably from 0.5 to 10 parts by weight.

(F) Solvent:

Not specifically defined, the solvent may be any one capable of dissolving the composition of the invention, but is preferably a solvent having a boiling point not lower than 100° C. in order that the solvent may not evaporate more than required during coating and the composition may not form a solid deposit during coating.

Further, when a solvent remains in the cured film, the film could not have good properties, and therefore, it is undesirable that a solvent having a boiling point not lower than the curing temperature accounts for at least 60% by mass of the whole solvent. As so mentioned in the above, when the boiling point of the solvent is low, the composition may form a solid deposit owing to the solvent evaporation during coating, and the solvent having a low boiling point is undesirable. Accordingly, preferred for use herein is a mixed solvent comprising a solvent (a) having a boiling point of from 100° C. to 170° C. and a solvent (b) having a boiling point of from 170° C. to 300° C.

The preferred solvent (a) includes propylene glycol monomethyl ether, propylene glycol monomethyl ether acetate, ethyl 3-ethoxypropionate, methyl 3-methoxypropionate, ethyl lactate, 3-methoxybutanol, cyclohexanone. The preferred solvent (b) is an organic solvent, including N-methylpyrrolidone (NMP), γ-butyrolactone (GBL), propylene carbonate, and their mixtures. However, the solvent for use in the invention should not be limited to these. More preferred are γ-butyrolactone and propylene carbonate.

Preferably, the ratio by mass of (a) to (b) is within a range of from 95/5 to 30/70, more preferably from 90/10 to 50/50.

(G) Patterning Method:

A method of forming a relief pattern by the use of the photosensitive resin composition of the invention comprises (1) first applying the photosensitive resin composition onto a suitable substrate, (2) then baking (pre-baking) the coated substrate, (3) exposing it to active rays or radiations, (4) developing it with an aqueous developer, and (5) curing it to give a cured relief pattern.

The coated and photoexposed substrate may be baked at a high temperature prior to development. The developed substrate may be rinsed prior to curing.

In the manner as above, the photosensitive resin composition of the invention may be applied onto a semiconductor element so that the coating film, after thermally cured, may have a predetermined thickness (for example, from 0.1 to 30 µm), then this may be pre-based, photoexposed, developed and thermally cured to produce a semiconductor device.

A method of forming a relief pattern is described in more detail hereinunder.

The photosensitive resin composition of the invention is applied onto a suitable substrate. The substrate is, for example, a semiconductor material such as a silicon wafer, or a ceramic substrate, glass, metal or plastic. The coating method includes spraying, spin coating, offset printing, roller coating, screen printing, extrusion coating, meniscus coating, curtain coating and dipping, to which, however, the invention should not be limited.

The coating film is pre-baked at an elevated temperature of from about 70 to 120° C. for a few minutes to a half hour, depending on the coating method. Subsequently, the obtained dry film is exposed to active rays or radiations via a mask in a desired pattern. As the active rays or radiations, usable are X rays, electron beams, UV rays, visible rays. A radiation having a wavelength of 436 nm (g-line) or 365 nm (i-line) is most preferred.

After the exposure to active rays or radiations, the coated and exposed substrate is advantageously heated at a temperature of from about 70 to 120° C. The coated and exposed substrate may be heated for a short period of time, generally for a few seconds to a few minutes, within the above temperature range. In general, this step of this process is technically referred to as post-exposure baking.

Next, the coating film may be developed with an aqueous developer, thereby forming a relief pattern. The aqueous developer may be an alkali solution of an inorganic alkali (e.g., potassium hydroxide, sodium hydroxide, aqueous ammonia), a primary amine (e.g., ethylamine, n-propylamine), a secondary amine (e.g., diethylamine, di-n-propylamine), a tertiary amine (e.g., triethylamine), an alcoholamine (e.g., triethanolamine), a quaternary ammonium salt (e.g., tetramethylammonium hydroxide, tetraethylammonium hydroxide), and their mixture. A most preferred developer contains tetramethylammonium hydroxide. In addition, a suitable amount of a surfactant may be added to the developer. The development may be attained by dipping, spraying, paddling or the like method of development.

If desired, the relief pattern may be rinsed with deionized water. Next, in order to obtain a final pattern of resin of good heat resistance, the relief pattern is cured to form an oxazole ring. The curing may be attained by baking the substrate at a glass transition temperature Tg of the resin, in order that an oxazole ring capable of forming a final pattern of good heat resistance could be formed. In general, patterning may be attained through thermal curing at a temperature of from about 300 to 400° C. However, the composition of the invention may form a film having physical properties comparable to those of the film formed of a conventional composition, when thermally cured at a temperature lower than 300° C., more concretely at about 250° C.

EXAMPLES

The invention is described concretely with reference to the following Examples, to which, however, the invention should not be limited.

[Preparation of Resin]

(1) Production of Resin A-1:

293 g (0.8 mol) of hexafluoro-2,2-bis(3-amino-4-hydroxyphenyl)propane (by Nippon Kayaku), 126.6 g (1.6 mol) of pyridine and 1.2 kg of N-methyl-2-pyrrolidone (NMP) were put into a 3-liter three-neck flask. This was stirred at room temperature, and then cooled in a dry ice/acetone bath to −25° C. A mixed solution of 73.9 g (0.364 mol) of isophthaloyl chloride (by Tokyo Kasei), 107.4 g (0.364 mmol) of 4,4'-oxybisbenzoyl chloride (obtained by converting 4,4'-oxybisbenzoic acid (by Aldrich) into its acid chloride according to a fixed method) and 700 g of NMP was dropwise added to the solution with keeping the reaction temperature between −20° C. and −30° C. After the completion of the addition, the obtained mixture was stirred at room temperature for 16 hours. This was diluted with 2 L of acetone, and the resulting solution was put into 50 L of deionized water kept stirred vigorously, and the precipitated white powder was collected by filtration. This was washed with deionized water and a mixture of water/methanol (50/50). This was dried in vacuum at 40° C. for 24 hours to obtain the intended resin (a-1). The yield was almost quantitative, and the number-average molecular weight of the resin (a-1) was $6.4\times10^3$, as calculated in terms of polystyrene, and the degree of dispersion thereof was 2.1.

The resin (a-1) (400 g) was dissolved in PGMEA to prepare a 15% solution, to which was added 21 g of allyl chloroformate (by Tokyo Kasei), and stirred at room temperature for 3 hours. The obtained reaction solution was washed with water, then 200 g of toluene was added thereto, and the solvent was evaporated away at 60° C. to remove water from the system by azeotropic dehydration, thereby giving a solution having a solid concentration of 15%. Water in the system was 0.01%. 15 g of ethyl vinyl ether and 0.1 g of p-toluenesulfonic acid were added thereto, and stirred at room temperature for 3 hours. Further, 15 g of ethyl vinyl ether and 0.1 g of p-toluenesulfonic acid were added, and stirred at room temperature for 3 hours. 20 g of triethylamine was added to the obtained solution, and the reaction liquid was washed three times with water. Then, this was once diluted with 1 L of PGMEA added thereto, and thereafter the solvent was evaporated away at 50° C. to remove water from the system by azeotropic dehydration, thereby giving a PGMEA solution of resin A-1 having a solid concentration of 45%.

Its $^1$H NMR confirmed that the degree of introduction of allyl chloroformate was quantitative and that the degree of ethylacetal protection of the hydroxyl group was 21 mol %.

(2) Production of Resin A-2:

A PGMEA solution (45%) of resin A-2 was produced in the same manner as in Production Example 1 and using the resin (a-1) produced in Production Example 1, for which, however, ethylmalonyl chloride (by Aldrich) was used in place of allyl chloroformate. The number-average molecular weight of the resin A-2 was $6.5\times10^3$, as calculated in terms of polystyrene, and the degree of dispersion thereof was 2.1. Its $^1$H NMR confirmed that the degree of introduction of ethylmalonyl chloride was quantitative and that the degree of ethylacetal protection was 22 mol %.

(3) Production of Resin A-3:

A PGMEA solution (45%) of resin A-3 was produced in the same manner as in Production Example 1 and using the resin (a-1) produced in Production Example 1, for which, however, 5-norbornene-2,3-dicarboxylic acid anhydride (by Aldrich) was used in place of allyl chloroformate, pyridine was added during the reaction, the reaction temperature was 60° C. and the reaction time was 12 hours. The number-average molecular weight of the resin A-3 was $6.6\times10^3$, as calculated in terms of polystyrene, and the degree of dispersion thereof was 2.2. Its $^1$H NMR confirmed that the degree of introduction of 5-norbornene-2,3-dicarboxylic acid anhydride (imide form) was quantitative and that the degree of ethylacetal protection was 20 mol %.

(4) Production of Resin A-4:

293 g (0.8 mol) of hexafluoro-2,2-bis(3-amino-4-hydroxyphenyl)propane (by Nippon Kayaku), 126.6 g (1.6 mol) of pyridine and 1.2 kg of N-methyl-2-pyrrolidone (NMP) were put into a 3-liter three-neck flask. This was stirred at room temperature, and then cooled in a dry ice/acetone bath to −25° C. A mixed solution of 44.7 g (0.22 mol) of isophthaloyl chloride (by Tokyo Kasei), 147.6 g (0.5 mol) of 4,4'-oxybisbenzoyl chloride (obtained by converting 4,4'-oxybisbenzoic acid (by Aldrich) into its acid chloride according to a fixed method) and 700 g of NMP was dropwise added to the solution with keeping the reaction temperature between −20° C. and −30° C. After the completion of the addition, the obtained mixture was stirred at room temperature for 16 hours.

Next, a solution prepared by diluting 17 g (0.1 mol) of CKK-1 (by FUJIFILM) with 5 g of NMP was dropwise added to it, taking 10 minutes. Further, 50 g of pyridine was added, and stirred at 50° C. for 12 hours. The obtained solution was dropwise put into 2 L of distilled water, taking 1 hour, and the precipitated powder was collected by filtration. This was again put into 2 L of a solution of distilled water/methanol (1/1) to wash it, then collected by filtration and dried to obtain a resin A-4. The number-average molecular weight of the resin A-4 was $6.1\times10^3$, as calculated in terms of polystyrene, and the degree of dispersion thereof was 2.0.

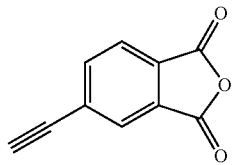

CKK-1

(5) Production of Resin A-5:

The above resin A-4 (400 g) was dissolved in PGMTA to prepare a 15% solution The solvent was evaporated away at 60° C. to remove water from the system by azeotropic dehydration, thereby giving a solution having a solid concentration of 20%. Water in the system was 0.01%. 20 g of butyl vinyl ether and 0.1 g of p-toluenesulfonic acid were added thereto, and stirred at room temperature for 3 hours. Further, 20 g of butyl vinyl ether and 0.1 g of p-toluenesulfonic acid were added, and stirred at room temperature for 3 hours. 20 g of triethylamine was added to the obtained solution, and the reaction liquid was washed three times with water. Then, this was once diluted with 1 L of PGMEA added thereto, and thereafter the solvent was evaporated away at 60° C. to remove water from the system by azeotropic dehydration, thereby giving a PGMEA solution of resin A-5 having a solid concentration of 45%. Its $^1$H NMR confirmed that the degree of butylacetal protection of the hydroxyl group was 17 mol %.

A-1

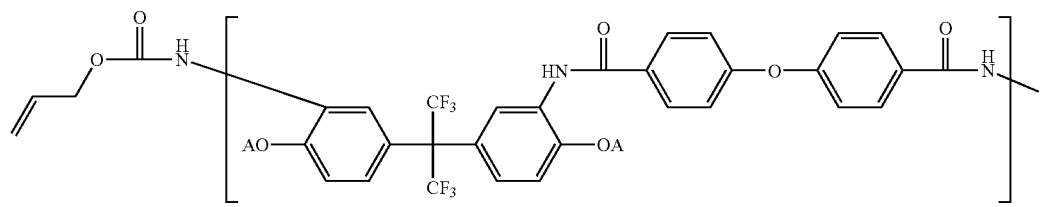

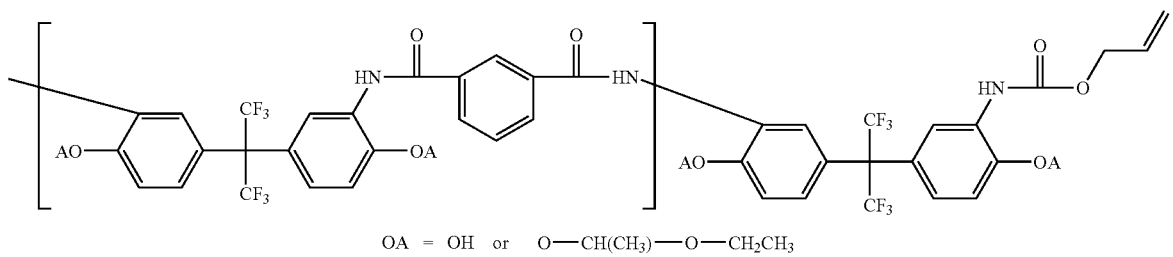

OA = OH or O—CH(CH$_3$)—O—CH$_2$CH$_3$

A-2

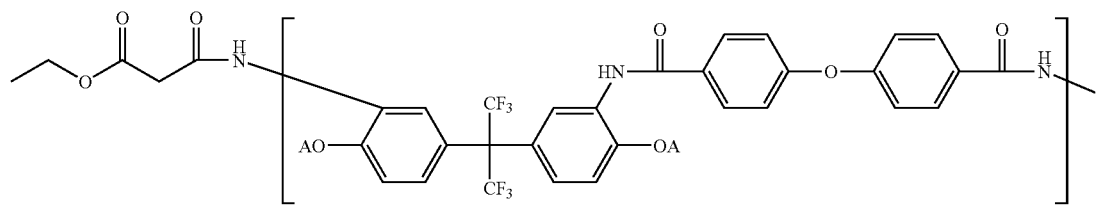

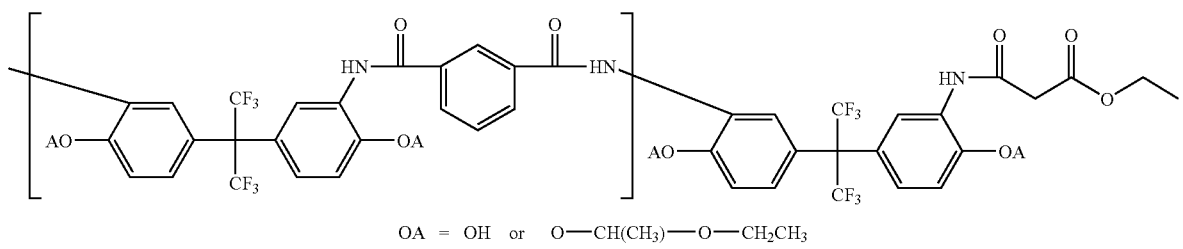

OA = OH or O—CH(CH$_3$)—O—CH$_2$CH$_3$

A-3

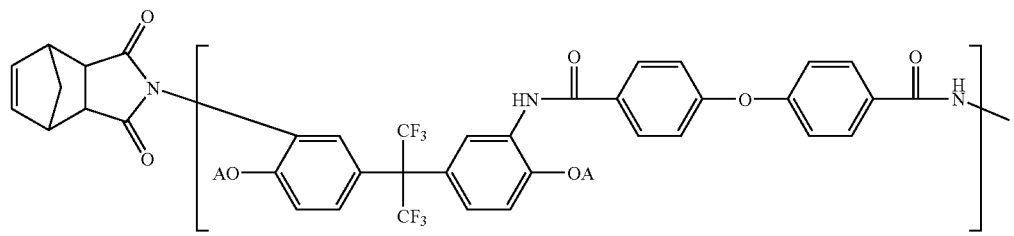

-continued

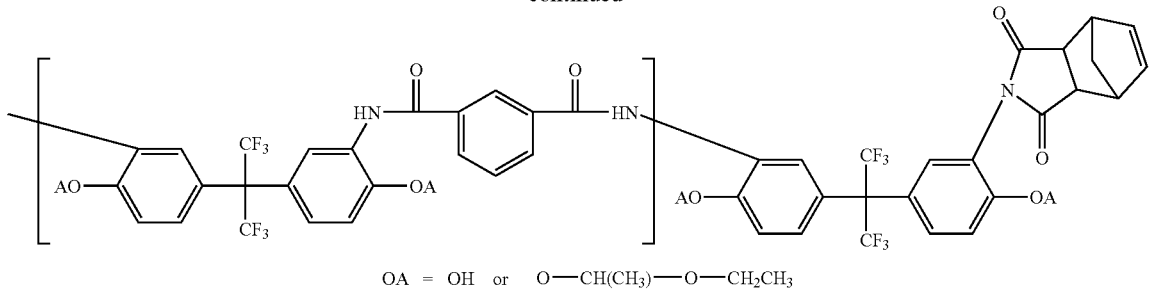

OA = OH or O—CH(CH₃)—O—CH₂CH₃

A-5

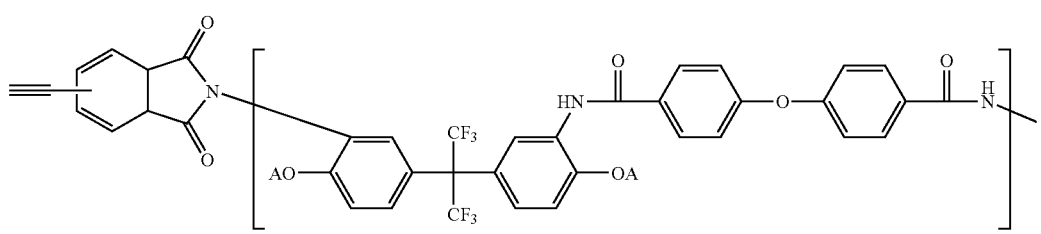

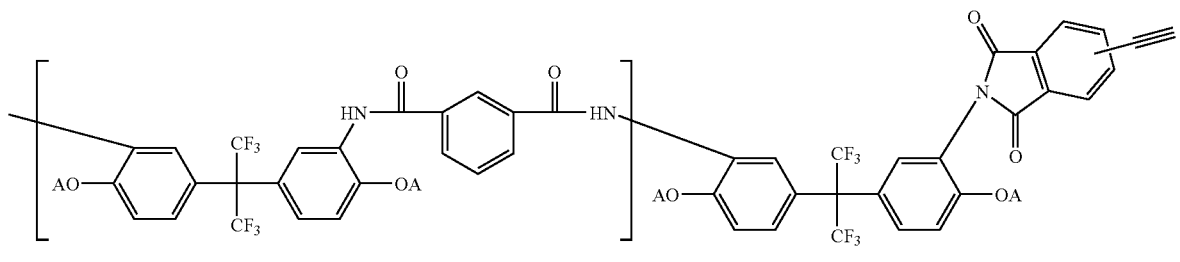

OA = OH or O—CH(CH₃)—O—C₄H₉

A-4 is a resin corresponding to A-5 with no acetal protection (OA=OH).

[Production of Photosensitive Agent]

(1) Production of Photosensitive Agent (P-1):

21.6 g of a phenol compound mentioned below (BP-1) and 200 mL of 1,4-dioxane were put into a three-neck flask, and dissolved to give a uniform solution. Next, 27 g of 1,2-naphthoquinonediazide-4-sulfonyl chloride was added and dissolved. The reaction chamber was cooled with ice in water to 10° C., then 11.1 g of triethylamine was dropwise added, taking 1 hour. After the addition, this was stirred for 24 hours. After the reaction, distilled water was added to dissolve the precipitated salt, stirred for 30 minutes, neutralized with diluted hydrochloric acid, and 1 L of distilled water was added for crystallization. The precipitated dark yellow powder was collected by filtration. The filtrate was again dissolved in 200 mL of dioxane, and this was then crystallized in 1 L of distilled water. The precipitated matter was collected by filtration, the collected matter washed with 1 L of distilled water, and then filtered to collect 39 g of the intended dark yellow powder product (P-1). The obtained (P-1) was analyzed with high-performance liquid chromatography (Waters' S1525), and the purity of the esterified product of the phenol compound (BP-1) was 98% (wavelength for detection, 254 nm).

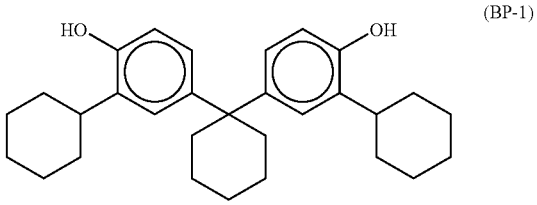

(BP-1)

(2) Production of Photosensitive Agent (P-2):

A photosensitive agent (P-2) was produced in the same manner as in the above Production Example, for which, however, the phenol compound to be used was changed to the following (BP-2) and the amount 1,2-naphthoquinonediazide-4-sulfonyl chloride was increased to two times. The obtained (P-2) was analyzed through high-performance liquid chromatography (Waters' S1525), and the purity of the esterified product of the phenol compound (BP-2) was 97.5% (wavelength for detection, 254 nm).

[Preparation of Photosensitive Resin Composition]

The resin, the photosensitive agent, the solvent and the additives shown in Table 1, and the silane coupling agent shown below (2% by mass of all the solid content) were mixed by stirring. Next, this was filtered through a cassette filter of PTFE (0.1 μm) to prepare a photosensitive resin composition.

The photosensitive agent and the additives shown in Table 1 as their abbreviations and the compounds used as other additives are mentioned below.

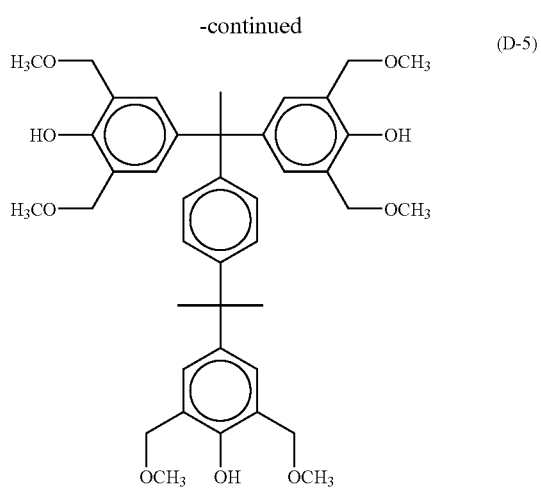

(D-5)

GBL: γ-butyrolactone
PGMEA: propylene glycol monomethyl ether acetate
EL: ethyl lactate <Image Performance (Resolution Limit, Film Retentiveness)>

The prepared composition was applied onto a silicon wafer in a mode of spin coating, and then baked on a hot plate at 120° C. for 4 minutes to form a film having a thickness of 7 μm. Using an i-line stepper, this film was photoexposed via a pattern mask with repetitive 4-micron via holes to a photoexposure level enough for reproduction of the 5-micron pattern.

Next, except for the compositions 4 and 5, the sample was heated at 90° C. for 3 minutes, and then statically developed for 60 seconds with an aqueous 2.38 mas. % TMAH solution applied onto the substrate. Then, this was rinsed with deionized water. Next, this was baked on a hot plate at 100° C. for 2 minutes. After the development, the film thickness was measured, and the film retentiveness was determined.

Film Retentiveness (%)=[(film thickness before development−film thickness after development)×100]/(film thickness before development).

Further, the obtained pattern was analyzed with SEM to determine the resolution limit.

<Heat Resistance>

The prepared resin solution was applied onto a silicon wafer in a mode of spin coating, then baked on a hot plate at 120° C. for 4 minutes, and further heated in nitrogen at 250° C. for 60 minutes. The obtained film was analyzed for the thermal mass reduction in TGA (the film was heated from 30° C. to 400° C. at a heating speed of 10° C./min to determine the film mass reduction by the heating).

<Chemical Resistance>

The prepared resin solution was applied onto a silicon wafer in a mode of spin coating, then baked on a hot plate at 120° C. for minutes, and further heated in nitrogen at 250° C. for 30 minutes. The obtained film was peeled from the wafer, dipped in THF for 2 hours, then pulled up and dried, and the mass change before and after the dipping was computed.

Chemical Resistance (%)=[100×(film mass before dipping−film mass after dipping)]/(film mass before dipping).

The test results are shown in Table 1.

TABLE 1

| | Resin | Solvent | Photosensitive Agent | Sulfonate ester | Methylol Compound | Resolving Power (μm) | Film Retentiveness (%) | Heat Resistance (%) | Chemical Resistance (%) |
|---|---|---|---|---|---|---|---|---|---|
| Example | | | | | | | | | |
| 1 | A-1 110 g | GBL 15 g | P-3 3 g | C-1 4 g | D-1 8 g | 2 | 95 | 4.8 | 95 |
| 2 | A-2 110 g | GBL 12 g PC 3 g | P-3 3 g | C-2 4 g | D-2 8 g | 2 | 95 | 4.8 | 90 |
| 3 | A-3 110 g | GBL 15 g | P-3 3 g | C-3 4 g | D-3 8 g | 2 | 95 | 5 | 90 |
| 4 | A-4 50 g | PGMEA 60 g GBL 15 g | P-1 7 g | C-4 4 g | D-4 8 g | 2 | 85 | 5.3 | 95 |
| 5 | A-4 50 g | PGMEA 60 g GBL 15 g | P-2 7 g | C-5 4 g | D-5 8 g | 2 | 85 | 5.5 | 95 |
| 6 | A-5 110 g | GBL 15 g | P-3 3 g | C-1 4 g | D-2 8 g | 2 | 95 | 4.8 | 90 |
| 7 | A-1 110 g | GBL 15 g | P-1 2 g P-3 2 g | C-4 4 g | D-5 7 g | 2 | 95 | 4.8 | 95 |
| 8 | A-3 110 g | GBL 15 g | P-3 3 g | C-1 4 g | D-1 4 g D-5 4 g | 2 | 95 | 4.6 | 96 |
| 9 | A-3 110 g | EL 5 g GBL 10 g | P-3 3 g | C-1 4 g | D-2 8 g | 2 | 95 | 4.8 | 90 |

TABLE 1-continued

|  | Resin | Solvent | Photosensitive Agent | Sulfonate ester | Methylol Compound | Resolving Power (μm) | Film Retentiveness (%) | Heat Resistance (%) | Chemical Resistance (%) |
|---|---|---|---|---|---|---|---|---|---|
| 10 | A-5 110 g | GBL 15 g | P-3 3 g | C-1 4 g | D-2 8 g D-5 4 g | 2 | 95 | 4.8 | 96 |
| 11 | A-4 50 g | PGMEA 60 g GBL 15 g | P-3 3 g | C-4 4 g |  | 2 | 85 | 5.7 | — |
| 12 | A-4 50 g | PGMEA 60 g GBL 15 g | P-3 3 g | C-1 4 g |  | 2 | 85 | 5.7 | — |
| 13 | A-4 50 g | PGMEA 60 g GBL 15 g | P-3 3 g | C-1 2.5 g | D-2 8 g | 2 | 85 | 5.9 | 88 |
| Comparative Example |  |  |  |  |  |  |  |  |  |
| 1 | A-4 50 g | PGMEA 60 g GBL 15 g | P-3 3 g | C-6 4 g | D-2 8 g | 2 | 85 | 6.5 | 80 |
| 2 | A-4 50 g | PGMEA 60 g GBL 15 g | P-3 3 g | C-7 4 g | D-2 8 g | 2 | 85 | 6.5 | 80 |
| 3 | A-4 50 g | PGMEA 60 g GBL 15 g | P-3 3 g | C-6 4 g |  | 2 | 85 | 7.3 | — |
| 4 | A-4 50 g | PGMEA 60 g GBL 15 g | P-3 3 g | C-7 4 g |  | 2 | 85 | 7.3 | — |
| 5 | A-4 50 g | PGMEA 60 g GBL 15 g | P-3 3 g | C-6 8 g | D-2 8 g | 2 | 85 | 6.8 | 80 |

As in Table 1, it is known that the composition of the invention is excellent in all the resolving power, the film retentiveness, the heat resistance and the chemical resistance.

According to the invention, there is provided a photosensitive resin composition having excellent lithography performance and capable of forming a cured relief pattern excellent in heat resistance through low-temperature curing.

The entire disclosure of each and every foreign patent application from which the benefit of foreign priority has been claimed in the present application is incorporated herein by reference, as if fully set forth.

What is claimed is:

1. A photosensitive resin composition comprising:
(A) a polyamide resin comprising a structure represented by general formula (1);
(B) a photosensitive agent; and
(C) a sulfonate ester represented by general formula (2),

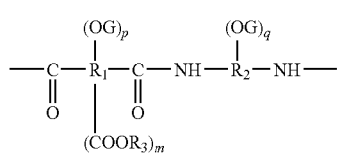
(1)

wherein $R_1$ represents a 2-valent to 8-valent organic group having at least 2 carbon atoms; $R_2$ represents a 2-valent to 6-valent organic group having at least 2 carbon atoms; G and $R_3$ each independently represents a hydrogen atom or an organic group having from 1 to 20 carbon atoms; m indicates an integer of from 0 to 2; p and q each independently indicates an integer of from 0 to 4, provided that p+q>0,

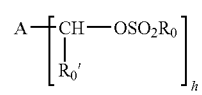
(2)

wherein A represents an h-valent linking group;

$R_0$ represents an alkyl group, an aryl group, an aralkyl group or a cyclic alkyl group;

$R_0'$ represents a hydrogen atom, an alkyl group or an aralkyl group; and h indicates from 2 to 8.

2. The photosensitive resin composition as claimed in claim 1, wherein the polyamide resin comprises a structure represented by general formula (3):

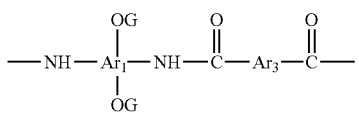

(3)

wherein $Ar_1$ represents a group selected from a 4-valent aromatic group and a 4-valent heterocyclic group; $Ar_3$ represents a group selected from a 2-valent aromatic group, a 2-valent heterocyclic group, a 2-valent aliphatic group and a 2-valent alicyclic group; G has the same meaning as in formula (1).

3. The photosensitive resin composition as claimed in claim 2,
wherein the polyamide resin further comprises a structure represented by general formula (4):

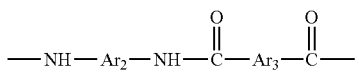

(4)

wherein $Ar_2$ represents a group selected from a 2-valent aromatic group, a 2-valent heterocyclic group, a 2-valent alicyclic group, and a 2-valent aliphatic group which may have silicon; $Ar_3$ represents a group selected from a 2-valent aromatic group, a 2-valent heterocyclic group, a 2-valent aliphatic group and a 2-valent alicyclic group.

4. The photosensitive resin composition as claimed in claim 2,
wherein a protective group represented by the group G in formula (3) is a group that decomposes by action of an acid to generate an alkali-soluble group.

5. The photosensitive resin composition as claimed in claim 1, further comprising (D) a compound containing an alkoxymethyl group or an acyloxymethyl group.

6. The photosensitive resin composition as claimed in claim 1, further comprising (E) an adhesion promoter.

7. A method for producing a cured relief pattern,
the method comprising;
forming a layer of the photosensitive resin composition as claimed in claim 1, on a semiconductor substrate;
exposing the layer to any of light rays, electron rays and ion rays via a mask so as to form an exposed part;
removing the exposed part with an aqueous alkali developer so as to form an relief pattern; and
heating the relief pattern so as to form the cured relief pattern.

8. A semiconductor device comprising the cured relief pattern obtained in the production method as claimed in claim 7.

* * * * *